United States Patent [19]
Oka et al.

[11] Patent Number: 5,661,223
[45] Date of Patent: Aug. 26, 1997

[54] COMPOSITION OF PHENOLIC RESIN-MODIFIED EPOXY RESIN AND STRAIGHT CHAIN POLYMER

[75] Inventors: Seiji Oka; Mitsuhiro Nonogaki; Takumi Kikuchi; Takashi Takahama; Hiroyuki Nakajima, all of Amagasaki; Michio Futakuchi, Sagamihara, all of Japan

[73] Assignee: Mitsubishi Denki Kabushiki Kaisha, Tokyo, Japan

[21] Appl. No.: 476,578

[22] Filed: Jun. 7, 1995

Related U.S. Application Data

[63] Continuation of Ser. No. 285,774, Aug. 4, 1994, abandoned, which is a continuation of Ser. No. 155,243, Nov. 22, 1993, abandoned, which is a continuation of Ser. No. 514,243, Apr. 25, 1990, abandoned.

[30] Foreign Application Priority Data

| Apr. 25, 1989 | [JP] | Japan | 1-105624 |
| May 12, 1989 | [JP] | Japan | 1-119415 |
| May 26, 1989 | [JP] | Japan | 1-134101 |
| May 26, 1989 | [JP] | Japan | 1-134102 |
| May 26, 1989 | [JP] | Japan | 1-134103 |
| Nov. 24, 1989 | [JP] | Japan | 1-305331 |
| Nov. 24, 1989 | [JP] | Japan | 1-305332 |
| Nov. 24, 1989 | [JP] | Japan | 1-305334 |

[51] Int. Cl.⁶ .......... C08L 63/02; C08L 63/00
[52] U.S. Cl. .......... 525/481; 525/423; 525/438; 525/482; 525/485; 525/486; 525/488; 525/109
[58] Field of Search .......... 525/109, 423, 525/438, 482, 485, 486, 488, 489, 527, 481

[56] References Cited

U.S. PATENT DOCUMENTS

| 3,496,130 | 2/1970 | Wasem et al. | 260/26 |
| 4,282,136 | 8/1981 | Hunt et al. | 525/481 |
| 4,390,664 | 6/1983 | Kanayama . | |
| 4,394,496 | 7/1983 | Schrader . | |
| 4,868,059 | 9/1989 | Walker et al. | 525/482 |
| 5,006,611 | 4/1991 | Schmid et al. | 525/423 |
| 5,026,789 | 6/1991 | Weber et al. | 525/535 |
| 5,030,698 | 7/1991 | Mülhaupt et al. | 525/423 |
| 5,091,481 | 2/1992 | Nakajima et al. | 525/423 |

FOREIGN PATENT DOCUMENTS

| 0 264 705 | 4/1988 | European Pat. Off. . |
| 0352550 | 1/1990 | European Pat. Off. . |
| 0 372 983 | 6/1990 | European Pat. Off. . |
| 0 373 440 | 6/1990 | European Pat. Off. . |
| 0 379 468 | 7/1990 | European Pat. Off. . |
| 0 381 625 | 8/1990 | European Pat. Off. . |

OTHER PUBLICATIONS

Patent Abstracts of Japan vol. 11, No. 96 (C–412) (2543), 26 Mar. 1987; & JP–A–61246228 (Shin Kobe Electric Mach) Nov. 1, 1986.

*Primary Examiner*—Robert E. Sellers
*Attorney, Agent, or Firm*—Oblon, Spivak, McClelland, Maier & Neustadt, P.C.

[57] ABSTRACT

A resin composition for a laminate comprises 100 parts by weight of a polyfunctional epoxy resin (I) obtained by (i)(1) glycidylizing a polycomposite formed from a blend of brominated bisphenol A and bisphenol A, or brominated bisphenol A and formaldehyde; or (2) a mixture of a polyfunctional epoxy resin and a bisphenol A-advanced epoxy resin reacted with brominated bisphenol A in a hydroxyl:epoxy equivalent ratio of from 0.05–0.5:1 and (ii) a bisphenol A-formaldehyde phenolic resin having a weight average molecular weight of from 1,000–10,000 in a hydroxyl:epoxy equivalent ratio with respect to epoxy resin (i) of from 0.7–1.2:1; and (II) from 1–60 parts by weight of a straight chain polymer (c) such as a poly(ether)sulfone, aromatic polyester, phenoxy resin, polyparabanic acid, polyetherimide or polyphenylene sulfide.

1 Claim, No Drawings

COMPOSITION OF PHENOLIC RESIN-MODIFIED EPOXY RESIN AND STRAIGHT CHAIN POLYMER

This is a continuation of application Ser. No. 08/285,774 filed on Aug. 4, 1994, now abandoned, which is a continuation of application Ser. No. 08/155.243 filed on Nov. 22, 1993, now abandoned, which is a continuation of application Ser. No. 07/514,243 filed on Apr. 25, 1990, now abandoned.

This invention relates to a resin composition for laminate, and, more particularly, it is concerned with a resin composition for laminated plates, which has excellent heat-resistance, moisture-resistance, and also mechanical properties, adhesiveness, electrical insulation, and other properties. Demand for the laminate, above all the copper-lined laminated plate, has been increasing remarkably. To meet such high demand, there have been produced varieties of copper-lined laminated plates adapted to specific purposes, by combination of base materials and thermosetting resins. In the field of household electronic apparatuses and appliances such as color-television, audio-appliances, and so forth, there has been principally used the copper-lined laminated plate made of paper as the base material and phenolic resin, while, in the field of industrial electronic apparatuses and appliances such as computers, control devices, measuring devices, and others, there has been principally used the copper-lined laminated plate made of paper as the base material and epoxy resin.

With development, however, of high density wiring and multi-layering in these laminated plates, there has arisen a new situation such that the conventional copper-lined laminate made of glass as the base material and epoxy resin can no longer satisfy the required specifications in respect of its dimensional stability, heat-resistance, and other properties, with the consequence that emergence of a copper-lined laminate which is excellent in its heat-resistant property has been desired.

As the copper-lined laminate which is excellent in its heat-resistant property, there has been known one, as disclosed, for example, in Japanese Patent Publication No. 26423/1985. This copper-lined laminate is made of polyimide resin (e.g., polyaminobismaleimide resin) and glass base. This laminated plate possesses various characteristics such that it has high glass transition temperature, it has high dimensional stability when heated, and others.

However, the above-mentioned polyimide resin possesses various shortcomings such that it is very hygroscopic, hence it has a problem in its dimensional stability with a hot and humid environment, that it requires a high boiling point polar solvent at the time of manufacturing a prepreg, hence the solvent tends to remain in the laminate at the time of its shaping. As the consequence, the laminated plates as produced are variable in their quality, and the solution for this problem has long been a serious problem.

The present invention has been made with a view to solving such problem, and aims at providing a resin composition for the laminate, the cured substance of which is as excellent in its heat-resistant property as that of the conventional cured substance, and moreover, is superior in its toughness and adhesiveness such that, when it is used for producing the copper-lined laminate, it exhibits satisfactory properties.

It is another object of the present invention to provide a resin composition for laminated plate, which is excellent in its toughness and adhesiveness.

It is still another object of the present invention to provide a resin composition for laminated plate, which, in addition to the above-mentioned object, is excellent in its moisture-resistant property and mechanical strength.

According to the present invention, in one aspect of it, there is provided a resin composition for laminate, which comprises a mixture of a poly-functional epoxy resin ($\alpha$), a poly-functional phenolic resin ($\beta$), and a straight chain high molecular weight compound ($\gamma$).

According to the present invention, in another aspect of it, there is provided a resin composition for laminate, which comprises a mixture of 100 parts by weight of a composition (I), and 1 to 60 parts by weight of a straight chain high molecular weight compound ($\gamma$) having a molecular weight of 5,000 and above, but not exceeding 100,000, and being miscible with this composition (I), this composition (I) being obtained by mixing a poly-functional epoxy resin ($\alpha$) represented by the following general formula, and having a molecular weight of 1,000 to 3,000, which is produced by glycidylizing a poly-composite substance formed of brominated bisphenol A and bisphenol A, or brominated bisphenol A and formaldehyde, with a poly-functional phenolic resin ($\beta$) having a weight average molecular weight of 1,000 or above, but not exceeding 10,000, which is a polycondensate formed of bisphenol A and formaldehyde, at such a mixing ratio that the hydroxyl group in the phenolic resin ($\beta$) is in a range of from 0.7 to 1.2 equivalents with respect to 1 equivalent of the terminal epoxy group in the poly-functional epoxy resin ($\alpha$):

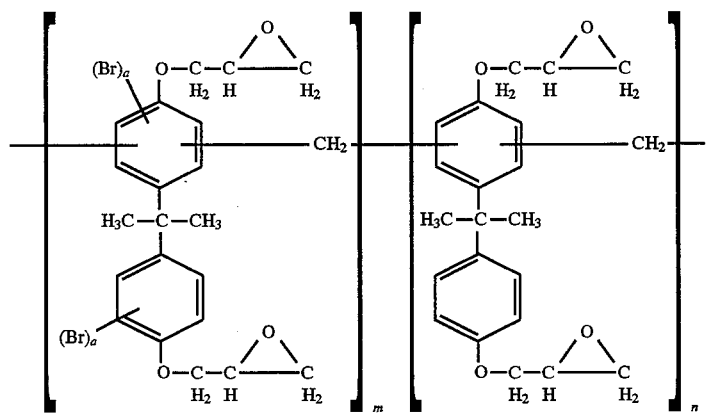

[where: m/n is an integer of 1–10, or n=0; and a is an integer of 1–2].

According to the present invention, in still another aspect of it, there is provided a resin composition for a laminated plate, which comprises a mixture of: a composition, which is obtained by mixing 100 parts by weight of a composition (A) comprising a poly-functional epoxy resin (α) to be represented by the following general formula and a poly-functional phenolic resin (β), at such a mixing ratio that the hydroxyl group in the poly-functional phenolic resin (β) ranges from 0.7 to 1.2 equivalents with respect to 1 equivalent of the terminal epoxy group in the poly-functional epoxy resin (α), and 10 to 200 parts by weight of a bismaleimide triazine compound or an imide composition (B) which is resulted from preliminary reaction of an aromatic diamine compound with a bismaleimide compound at a molar ratio of from 0.3 to 1.0 with respect to bismaleimide compound; and 1 to 100 parts by weight of a straight chain high molecular weight compound (γ) having a molecular weight of 3,000 or above, which is soluble in a solvent capable of dissolving the above-mentioned compositions (A) and (B):

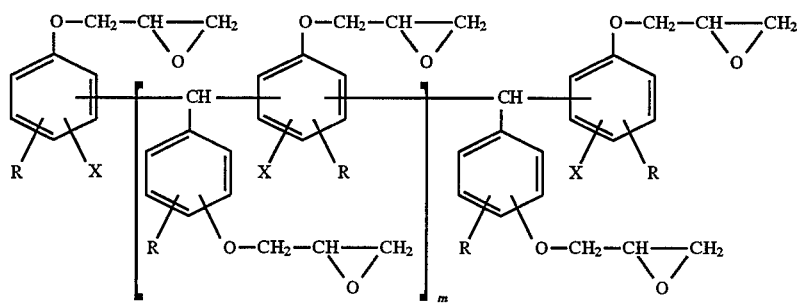

[where: R denotes hydrogen, or alkyl group having a carbon content of from 1 to 18; X represents halogen or hydrogen; and m is an integer of 0, or 1, or more].

According to the present invention in other aspect of it, there is provided a resin composition for laminate, which comprises a mixture of: a composition obtained by mixing 1 to 100 parts by weight of a straight chain high molecular weight compound (γ) having a molecular weight of from 5,000 to 100,000, and 100 parts by weight of a composition (I) comprising a poly-functional epoxy resin (α) to be represented by the following general formula and a poly-functional phenolic resin (β), at such a mixing ratio that the hydroxyl group in the phenolic resin (β) ranges from 0.7 to 1.2 equivalent with respect to 1 equivalent of the terminal epoxy group in the poly-functional epoxy resin (α):

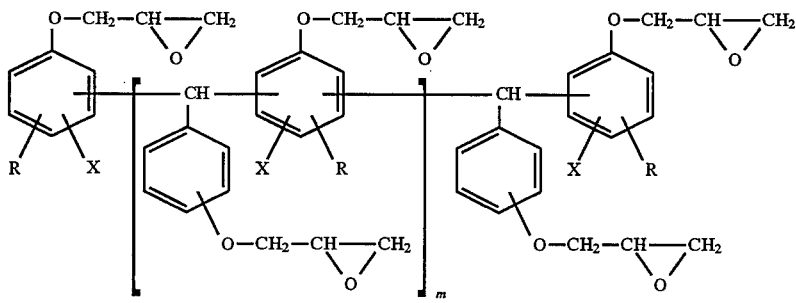

[where: R is hydrogen or $CH_3$; X is Br or hydrogen; and m is an integer of from 0 to 5].

According to the present invention in still other aspect of it, there is provided a resin composition for laminate, which comprises a mixture of 1 to 100 parts by weight of a straight chain high molecular weight compound (γ) having a molecular weight of from 5,000 to 100,000 and a composition (II) obtained by mixing 10 to 200 parts by weight of a bismaleimide triazine compound or a composition which is resulted from preliminary reaction of an aromatic diamine compound with a bismaleimide compound at a molar ratio of from 0.3 to 1.0 with respect to the bismaleimide compound, and 100 parts by weight of a composition (I) comprising a poly-functional epoxy resin (α) to be represented by the following general formula and a phenolic resin (β), at such a mixing ratio that the hydroxyl group in the phenolic resin (β) ranges from 0.7 to 1.2 equivalent with respect to 1 equivalent of the terminal epoxy group in the poly-functional epoxy resin (α):

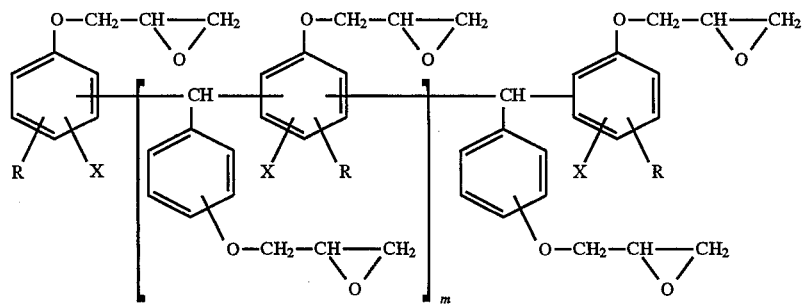

[where: R is hydrogen or $CH_3$; X is hydrogen or Br; and m is an integer of from 0 to 5].

According to the present invention in still other aspect of it, there is provided a resin composition for laminate, which comprises a mixture of: 100 parts by weight of a composition (Ia) comprising a poly-functional epoxy resin ($\alpha_1$) to be represented by the following general formula

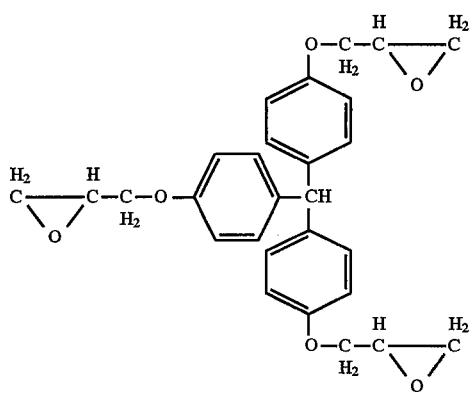

and brominated bisphenol A ($\beta_1$) to be represented by the following general formula

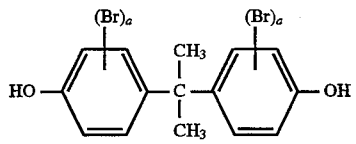

[where: a is an integer of 1 to 4] at such a mixing ratio that the hydroxyl group in brominated bisphenol A ($\beta_1$) ranges from 0.7 to 1.2 equivalents with respect to 1 equivalent of the terminal epoxy group in the poly-functional epoxy resin ($\alpha_1$); and 1 to 60 parts by weight of a straight chain high molecular weight compound ($\gamma$) having a molecular weight of from 5,000 to 100,000, which is miscible with the above-mentioned composition (Ia).

According to the present invention in further aspect of it, there is provided a resin composition for laminate, which comprises a mixture of: 100 parts by weight of a composition (Ib) comprising a poly-functional epoxy resin ($\alpha_2$) to be represented by the following general formula

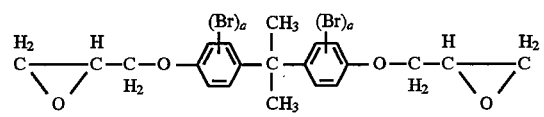

[where: a is an integer of 1 to 4], and phenolic resin ($\beta_2$) to be represented by the following general formula

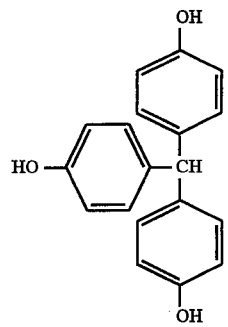

at such a mixing ratio that the hydroxyl group in phenolic resin ($\beta_2$) ranges from 0.7 to 1.2 equivalents with respect to 1 equivalent of the terminal epoxy group in the poly-functional epoxy resin ($\alpha_2$); and 1 to 60 parts by weight of a straight chain high molecular weight compound ($\gamma$) having a molecular weight of from 5,000 to 100,000, which is miscible with the above-mentioned composition (Ib).

According to the present invention in still further aspect of it there is provided a resin composition for laminate, which comprises a mixture of: 100 parts by weight of a composition comprising a phenolic resin ($\beta$) and an oligo-epoxy resin ($\alpha$) to be represented by the following general formula

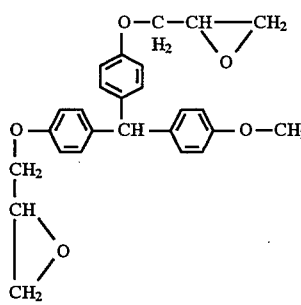
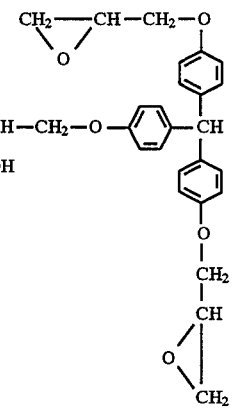

[where: a is an integer of 1 to 4], which is obtained by reacting brominated bisphenol A ($\beta_1$) to be represented by the following formula

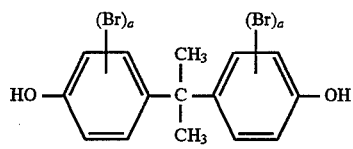

[where: a is an integer of 1 to 4] with a poly-functional epoxy resin ($\alpha_1$) to be represented by the following general formula

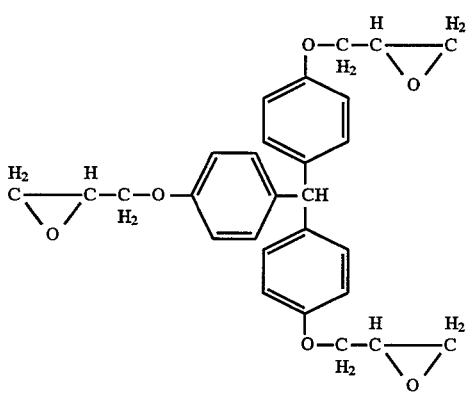

at such a mixing ratio that the epoxy group in the above-mentioned poly-functional epoxy resin ($\alpha_1$) ranges from 3 to 5 equivalents with respect to 1 equivalent of the hydroxyl group in the above-mentioned brominated bisphenol A ($\beta_1$); said oligo-epoxy resin ($\alpha$) thus obtained and said phenolic resin ($\beta$) being mixed at such a mixing ratio that the hydroxyl group in said phenolic resin ($\beta$) ranges from 0.7 to 1.2 equivalent with respect to 1 equivalent of the terminal epoxy group in said oligo-epoxy resin ($\alpha$); and 1 to 60 parts by weight of a straight chain high molecular weight compound ($\gamma$) having a molecular weight of from 5,000 to 100,000, which is miscible with the above-mentioned composition.

According to the present invention in more aspect of it, there is provided a resin composition for laminate, which comprises a mixture of 1 to 100 parts by weight of a straight chain high molecular weight compound ($\gamma$) having a molecular weight of from 5,000 to 100,000 and 100 parts by weight of a composition (A) obtained by mixing 100 parts by weight of a composition (I) comprising a mixture of a poly-functional epoxy resin ($\alpha$) to be represented by the following general formula and a phenolic resin ($\beta$), at such a mixing ratio that the hydroxyl group in the phenolic resin ($\beta$) ranges from 0.7 to 1.2 equivalent with respect to 1 equivalent of the terminal epoxy group in the poly-functional epoxy resin ($\alpha$):

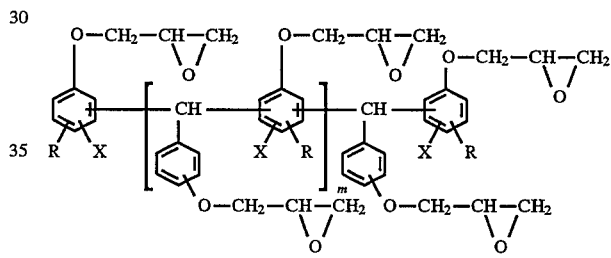

[where: R is hydrogen or $CH_3$; X is hydrogen or Br; and m is a integer of from 0 to 5].

According to the present invention in still more aspect of it, there is provided a resin composition for laminate, which comprises a mixture of 1 to 100 parts by weight of a straight chain high molecular weight compound ($\gamma$) having a molecular weight of from 5,000 to 100,000 and 100 parts by weight of a composition (X) obtained by mixing a poly-functional epoxy resin ($\alpha$) to be represented by the following general formula, a silicone-modified phenolic resin ($\beta$) obtained by mixing a silicone compound having an epoxy group in its molecular chain and phenolic resin at a mixing ratio of from 3 to 1,000 equivalents of the phenolic hydroxyl group with respect to 1 equivalent of the epoxy group in the silicone compound, and subjecting the mixture to preliminary reaction until 90% or above of the epoxy group becomes reacted, and a phenolic resin ($\beta'$), at such a ratio that the total equivalent of the phenolic hydroxyl group in the above-mentioned silicone-modified phenolic resin ($\beta$) and the phenlic resin ($\beta'$) ranges from 0.2 to 1.5 equivalents, and the molar mixing ratio of the above-mentioned silicone-modified phenolic resin ($\beta$) and the phenolic resin ($\beta'$)is in a range of from 1:9 to 8:2:

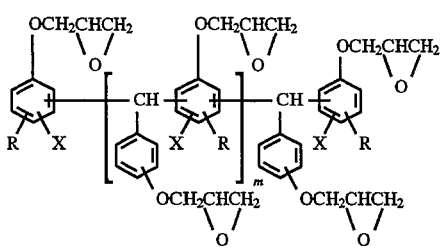

[where: R is hydrogen or $CH_3$; X is hydrogen or Br; and m is an integer of from 0 to 5].

According to the present invention in an additional aspect of it, there is provided a resin composition for laminate, which comprises a mixture of: 100 parts by weight of a composition (i) obtained by mixing a poly-functional epoxy resin (A) to be produced by reacting a composition, which is a blend of an epoxy resin composition ($\alpha$), obtained by mixing a poly-functional epoxy resin ($\alpha_1$) to be represented by the following general formula

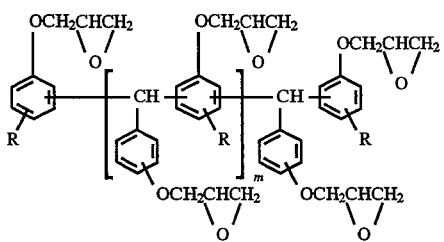

[where: R is hydrogen or $CH_3$; and m is an integer of from 0 to 5] and a bisphenol A type epoxy resin ($\alpha_2$) to be represented by the following general formula

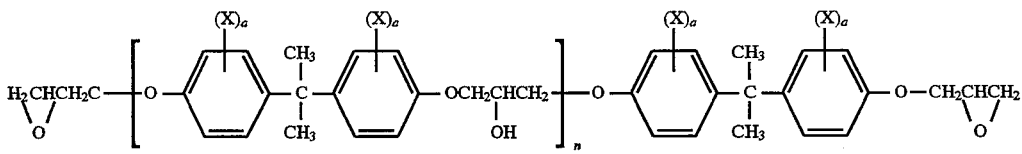

[where: n is an integer of 0 or above; X denotes bromine or hydrogen; and a is an integer of from 1 to 4] at a weight ratio of from 100:0 to 30:70, and brominated bisphenol A ($\beta$) to be represented by the following chemical formula

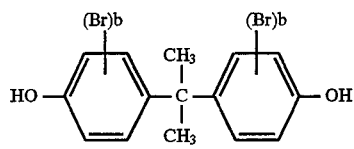

[where: b is an integer of from 1 to 4] at such a blending ratio that the hydroxyl group in the above-mentioned brominated bisphenol A ($\beta$) ranges from 0.05 to 0.5 equivalent with respect to 1 equivalent of the terminal epoxy group in the above-mentioned epoxy resin composition ($\alpha$), and by subjecting the composition to a reaction until a rate of reaction of the epoxy group and the hydroxyl group becomes 80% or above; and a phenolic resin (B) having a weight average molecular weight of from 1,000 to 10,000, which is a polycondensate of bisphenol A and formaldehyde, at such a mixing ratio that the hydroxyl group in the above-mentioned phenolic resin (B) ranges from 0.7 to 1.2 equivalents with respect to 1 equivalent of the terminal epoxy group in the above-mentioned poly-functional epoxy resin (A); and 1 to 60 parts by weight of a straight chain high molecular weight compound ($\gamma$) having a weight average molecular weight of from 5,000 to 100,000, which is miscible with the composition (I).

According to the present invention in more additional aspect of it, there is provided a resin composition for laminate, which comprises a mixture of: a composition (I) obtained by mixing a poly-functional epoxy resin (A) to be produced by reacting a composition, which is a blend of a poly-functional epoxy resin ($\alpha$) to be represented by the following general formula

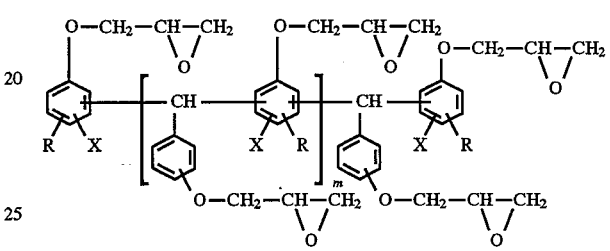

[where: R is hydrogen or $CH_3$; X denotes bromine or hydrogen; and m is an integer of from 0 to 5] and at least one kind of bisphenol A ($\beta_1$) to be represented by the following chemical formula

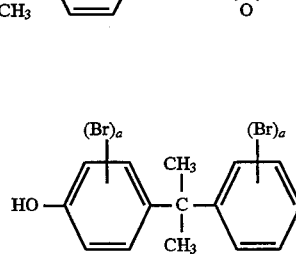

[where: a is an integer of from 1 to 4] and bisphenol A ($\beta_2$) to be represented by the following chemical formula

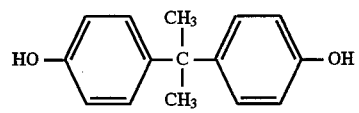

at such a blending ratio that the hydroxyl group in the above-mentioned composition ($\beta$) ranges from 0.05 to 0.5 equivalent with respect to 1 equivalent of the terminal epoxy group in the above-mentioned poly-functional epoxy resin composition ($\alpha$), and by subjecting the composition to a reaction until a rate of reaction of the epoxy group and the hydroxyl group becomes 80% or above; and a phenolic resin (B) having a weight average molecular weight of from 1,000 to 10,000, which is a polycondensate of bisphenol A and formaldehyde, at such a mixing ratio that the hydroxyl group in the above-mentioned phenolic resin (B) ranges from 0.7 to 1.2 equivalents with respect to 1 equivalent of the terminal epoxy group in the above-mentioned poly-functional epoxy resin (A); and 1 to 60 parts by weight of a straight chain high molecular weight compound ($\gamma$) having a molecular weight of from 5,000 to 100,000, which is miscible with the composition (I).

In the present invention, by reacting the poly-functional epoxy resin as the principal constituent with the phenolic resin, increased flexibility and cross-linking density as well as improved heat-resistance can be imparted to the resulting resin composition, and, on the other hand, interposition of a straight chain high molecular compound (or vinyl compound, as the case may be) in the cross-linked network structure adds to the resin composition its toughness, while maintaining its heat-resistance.

In particular, by reacting the poly-functional epoxy compound as the principal component with the polyphenol compound, it is possible to increase the moisture-resistant, the mechanical property, and further the cross-linking density, thereby improving the heat-resistance of the resulted compound; on the other hand, by addition of bismaleimide triazine compound, or a preliminary reaction product of the bismaleimide compound and aromatic diamine compound, it becomes possible to further improve the heat-resistance of the resulted compound. Also, by interposing a straight chain high molecular weight compound, as a linear flexible component, in the cross-linking network structure, the resulted compound becomes able to possess its flexibility, high adhesiveness, and toughness, while maintaining its moisture resistance, heat-resistance, and mechanical properties; at the same time, a general purpose low boiling point solvent can be used as a solvent, when producing a prepreg.

Also, in particular, by reacting the poly-functional epoxy resin as the principal component with the phenolic resin and a silicone-modified phenolic resin which is a preliminary reaction product of a silicone compound having an epoxy group and a phenolic resin, it becomes possible to increase cross-linking density, and to improve heat-resistance of the product composition; on the other hand, with the siloxane component being present in the skeleton of the silicone-modified phenolic resin, not only toughness of the composition increases, but also adhesiveness between the product composition and the glass base, whereby it becomes possible to obtain excellent moisture-resistance of the product composition at a high temperature as well as high reliability in its electrical insulation over a long period of time.

Moreover, inclusion in the poly-functional epoxy resin (A) of at least one kind of brominated bisphenol A ($\beta_1$) and bisphenol A ($\beta_2$) is particularly effective for the improvement in toughness and flexibility of the product composition, and use of phenolic resin, which is a polycondensate of bisphenol A and formaldehyde, is effective for the improvement in toughness and adhesiveness of the product composition.

(i) The poly-functional epoxy resin ($\alpha$) is a glycidylized product of brominated bisphenol A and bisphenol A, or brominated bisphenol A and formaldehyde, having a molecular weight of from 1,000 to 3,000. With the molecular weight being below 1,000, the final cured product becomes brittle; on the other hand, with the molecular weight exceeding 3,000, the curing reaction cannot be effected satisfactorily, whereby heat-resistance of the product composition becomes lowered. In addition, since the prepreg as produced is required to be fire-resistive, the molar ratio of brominated bisphenol A and bisphenol A, which are the essential components, should be in a range of from 1 to 10. With the molar ratio exceeding 10, the molecular weight becomes large with increased viscosity to make mixing of the components difficult. As the above-mentioned brominated bisphenol A, there may be used, for example, mono-brominated, di-brominated, or tetra-brominated bisphenol A.

Phenolic resin ($\beta$) as the curing agent for poly-functional epoxy resin ($\alpha$) according to the present invention is a poly-condensate of bisphenol A and formaldehyde, which is capable of preventing discoloration due to heat of a cured substance obtained by using other types of phenolic resin as the curing agent. This phenolic resin ($\beta$) has 2 weight average molecular weight of from 1,000 to 10,000. With its weight average molecular weight being below 1,000, no sufficient reactivity of the reactant can be obtained, and, moreover, the low molecular weight phenolic resin remains in the laminated plate to decrease its mechanical properties, heat-resistance, and moisture-resistance. On the contrary, when the weight average molecular weight of phenolic resin exceeds 10,000, reactivity with epoxy group becomes inferior. Therefore, in order to obtain the composition (I), the mixing quantity of phenolic resin should be such that the hydroxyl group in the phenolic resin ranges from 0.7 to 1.2 equivalents with respect to 1 equivalent of the terminal epoxy group in the above-mentioned poly-functional epoxy resin. With the mixing quantity of the phenolic resin not reaching 0.7 equivalent of the hydroxyl group contained therein, unreacted epoxy group remains in the product with the consequent decrease in the heat-resistant property. On the other hand, when it exceeds 1.2 equivalent, there remains in the product the phenolic resin which did not take part in the reaction with the consequent deterioration in the moisture-resistance and the heat-resistance of the product.

As the straight chain high molecular weight compound ($\gamma$) for the purpose of the present invention, there may be suitably used those compounds which are miscible with poly-functional epoxy resin ($\alpha$) and phenolic resin ($\beta$), such as polysulfone, polyethersulfone, polyester, phenoxy resin, and so forth. A preferred molecular weight of these straight chain high molecular weight compounds should usually be in a range of from 5,000 to 100,000. With the molecular weight of below 5,000, no flexibility-imparting effect of the straight chain high molecular weight compound can be obtained. On the contrary, when the molecular weight exceeds 100,000, viscosity of the resin increases excessively with the consequence that impregnation of the resin into the base material becomes insufficient.

The mixing quantity of this straight chain high molecular weight compound is in a range of from 1 to 60 parts by weight with respect to 100 parts by weight of the composition (I) obtained by mixing the above-mentioned poly-functional epoxy resin ($\alpha$) and phenolic resin ($\beta$). When the mixing quantity is below 1 pert by weight, the flexibility-imparting effect of this straight chain high molecular weight compound is not sufficient. On the contrary, when the mixing quantity exceeds 60 parts by weight, the straight chain high molecular weight compound deposits, in some cases, at the time of curing. In addition, viscosity of the resin increases excessively, whereby impregnation of the resin into the base material becomes insufficient at the time of producing the prepreg for lamination.

(ii) As the poly-functional epoxy resin, which is represented by the following general formula, there may be used, for example, TACTIX-742 (a tradename for a product of Dow Chemical Co.), EPPN 502 (a tradename for a product of Nihon Kayaku K. K.), and those compounds which were synthesized by the present inventors as shown in the preferred examples of the present invention to be given later.

compound can be obtained. On the contrary, when the molecular weight exceeds 100,000, viscosity of the resin increases excessively with the consequence that impregnation of the compound into the base material becomes insufficient. The mixing quantity of this straight chain high

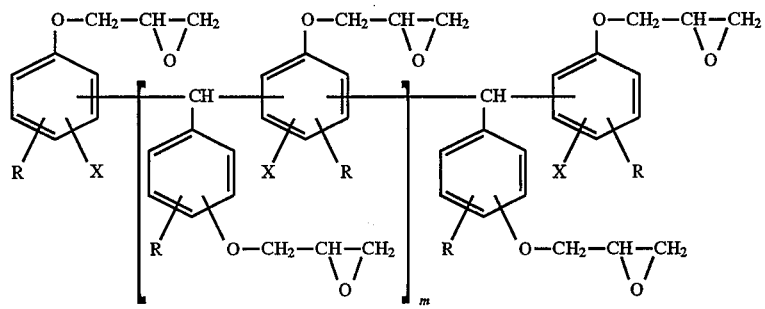

[where: R represents hydrogen or alkyl group having a carbon content of 1 to 18; X denotes halogen or hydrogen; and m is an integer of 0 or 1 or above]

In the above general formula, m is an integer of from 0 to 5. When m exceeds 5, the resin increases its viscosity excessively with the consequence that its impregnation into the base material becomes insufficient at the time of producing the prepreg for the laminated plate.

There is no particular limitation to the kind of phenolic resin for the purpose of the present invention. Examples of such phenolic resin are: phenol novolac resin such as, for example, PSF4261 (a tradename for a product of Gun-Ei Chemical Co. Ltd.), YLH-129 (a tradename for a product of Yuka-Shell Co. Ltd.), PZ-6000 (a tradename for a product of Hitachi Kasei K. K.) cresol novolac resin; alkyl-modified phenol novolac resin; bisphenol A type phenol novolac resin; and so forth. These resins may be used singly or in a combination of two or more kinds thereof. In particular, as the phenolic resin to be used for the preliminary reaction with the epoxy group of a silicone compound having the epoxy group, those having a softening point of from 60° C. to 110° C. are preferred.

Also, as the phenolic resin according to another object of the present invention, there may be used particularly a polycondensate ($\beta_1$) of bisphenol A and formaldehyde such as, for example, KP-756P (a tradename for a product of Arakawa Chemical Industry Co. Ltd.), YLH-129 (a tradename for a product of Yuka-Shell Co. Ltd.), and those which were synthesized by the present inventors as will be described later in reference to preferred examples.

Here, the molecular weight of the above-mentioned phenolic resins is in a range of from 1,000 to 10,000. With the molecular weight being below 1,000, the resin is inferior in its toughness. On the other hand, if the molecular weight exceeds 10,000, viscosity of the resin becomes too high, whereby impregnation of the resin into the base material becomes insufficient at the time of producing the prepreg for the laminated plate.

As the straight chain high molecular weight compounds for the purpose of the present invention, there may be suitably employed polyparabanic acid, polyethersulfone, polysulfone, polyetherimide, polyphenylenesulfide, phenoxy resin, and, in addition, liquid crystal polymers such as total aromatic polyester, etc. A preferred molecular weight of these straight chain high molecular weight compounds should usually be in a range of from 5,000 to 100,000. With the molecular weight of below 5,000, no flexibility-imparting effect of the straight chain high molecular weight molecular weight compound is in a range of from 1 to 100 parts by weight with respect to 100 parts by weight of the composition (I) or composition (II). When the mixing quantity is below 1 part by weight, the flexibility-imparting effect of this straight chain high molecular weight compound is not sufficient. On the contrary, when the mixing quantity exceeds 100 parts by weight, viscosity of the resin increases excessively, whereby impregnation of the resin into the base, material becomes insufficient at the time of producing the prepreg for laminated plate.

The mixing quantity of the above-mentioned polyfunctional epoxy resin and phenolic resin for obtaining the composition (I) according to the present invention is such that the hydroxyl group in the phenolic resin is in a range of from 0.7 to 1.2 equivalent with respect to 1 equivalent of the terminal epoxy group in the poly-functional epoxy resin. With the mixing quantity of the phenolic resin not reaching 0.7 equivalent of the hydroxyl group contained therein, unreacted epoxy group remains in the product with the consequent decrease in the heat-resistant property. On the other hand, when it exceeds 1.2 equivalent, there remains in the product the phenolic resin which did not take part in the reaction with the consequent deterioration in the moisture-resistance and the heat-resistance of the product.

As bismaleimide triazine compound according to still another object of the present invention, there amy be exemplified BT-2070, BT-2077, BT-2100, BT-2106, BT-2170, BT-2176, BT-2177, BT-2400, BT-2406, BT-2600, BT-2606, BT-2800, BT-3104, BT-3404 (all being the products of Mitsubishi Gas Kagaku K. K.). Further, as bismaleimide compound, there may be exemplified 4,4'-bismaleimide diphenylmethane, 4,4'-bismaleimide diphenylether, 4,4'-bismaleimide diphenylsulfone, 3,3'-bismaleimide diphenylmethane, 3,3'-bismaleimide diphenylether, 3,3'-bismaleimide diphenylsulfone, and so forth.

As aromatic diamine compound to be used for the preliminary reaction with these bismaleimide compounds, there may be exemplified diaminodiphenylether, diaminodiphenylmethane, diaminodiphenylsulfone, diaminobenzanilide, p-phenylenediamine, m-phenylenediamine, dibromodiaminodiphenylmethane, dibromodiaminodiphenylmethane diaminobenzoguanamine, tetrabromodiaminodiphenylmethane, 4-amino-benzoic acid-hydrazide, and so forth.

The mixing quantity of the aromatic diamine compound to be used for the preliminary reaction with bismaleimide compound to produce the imide compound is in a range of from 0.3 to 1.0 mol with respect to 1 mol of the bismaleimide compound. With the aromatic diamine compound of below 0.3 mol, unreacted bismaleimide compound remains in the resulted compound, which is not dissolved in a low boiling point solvent for general use. On the contrary, when it exceeds 1.0 mol, unreacted aromatic diamine compound remains in the product to become a curing agent for the poly-functional epoxy compound, whereby the pot life of the prepreg for the laminated plate becomes unfavorably short.

The imide composition to be produced by the preliminary reaction of bismaleimide compound and aromatic diamine compound, as one of the imide compositions to be used in still another object of the present invention, is obtained by dissolving bismaleimide compound and aromatic diamine compound in a low boiling point solvent such as dioxane, then subjecting the dissolved mixture to reaction in a nitrogen atmosphere at a temperature of from 80° C. to 110° C. for a time period of from two to four hours, and finally precipitating the reacted solution in water, etc. The thus obtained imide composition or bismaleimide triazine compound should preferably be in a range of from 10 to 200 parts by weight with respect to 100 parts by weight of the composition (I) which is a mixture of poly-functional epoxy compound and phenolic resin. When the imide composition is below 10 parts by weight, no improvement is seen in the heat-resistant property. On the contrary, when it exceeds 200 parts by weight, the heat-resistant property improves, but the moisture-resistant property and the mechanical properties (particularly, adhesive strength) become inferior.

(iii) The poly-functional epoxy resin ($\alpha_1$) is one as represented by the following chemical formula ("EPPN-501", a tradename for a product of Nihon Kayaku K. K.).

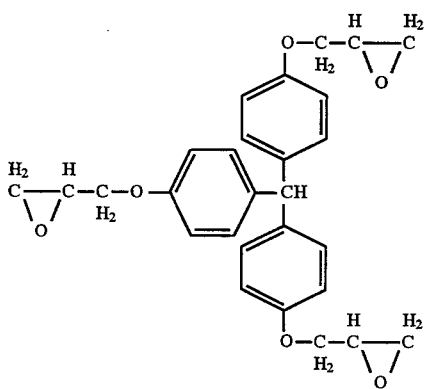

As brominated bisphenol A ($\beta_1$) to be used as the curing agent for the poly-functional epoxy resin ($\alpha_1$), there may be used, for example, monobrominated bisphenol A, dibrominated bisphenol A, and tetrabrominated bisphenol A. The mixing quantity of brominated bisphenol A ($\beta_1$) for obtaining the composition (Ia) should be such that the hydroxyl group in brominated bisphenol A is in a range of from 0.7 to 1.2 equivalent with respect to 1 equivalent of the terminal epoxy group in the above-mentioned poly-functional epoxy resin. With the mixing quantity of the brominated bisphenol A not reaching 0.7 equivalent of the hydroxyl group contained therein, unreacted epoxy group remains in the product with the consequent decrease in the heat-resistant property. On the other hand, when it exceeds 1.2 equivalent, there remains in the product the brominated bisphenol A which did not take part in the reaction with the consequent deterioration in the moisture-resistance and the heat-resistance of the product.

(iv) The poly-functional epoxy resin ($\alpha_2$) is one as represented by the following chemical formula.

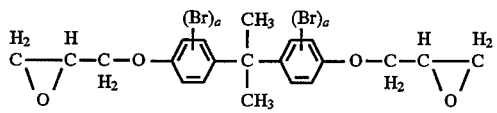

[where: a is an integer of 1 to 4]

When a=2, it is "DER-542"(a tradename for a product of Dow Chemical Co.)

The phenolic resin ($\beta_2$) to be used as the curing agent for the poly-functional epoxy resin is represented by the following chemical formula, which is a general reagent.

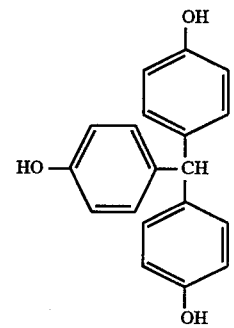

The mixing quantity of this phenolic resin ($\beta_2$) for obtaining the composition (Ib) should be such that the hydroxyl group in phenolic resin ($\beta_2$) is in a range of from 0.7 to 1.2 equivalent with respect to 1 equivalent of the terminal epoxy group in the above-mentioned poly-functional epoxy resin ($\alpha_2$). With the mixing quantity of the phenolic resin ($\beta_2$) not reaching 0.7 equivalent of the hydroxyl group contained therein, unreacted epoxy group remains in the product with the consequent decrease in the heat-resistant property. On the other hand, when it exceeds 1.2 equivalent, there remains in the product the phenolic resin which did not take part in the reaction with the consequent deterioration in the moisture-resistance and the heat-resistance of the product.

As the straight chain high molecular weight compound ($\gamma$) for the purpose of the present invention, there may be suitably used those compounds which are miscible with poly-functional epoxy resins ($\alpha_1$), ($\alpha_2$), brominated phenol A ($\beta_1$), and phenolic resin ($\beta_2$), such as polysulfone, polyethersulfone, polyester, phenoxy resin, and so forth. A molecular weight of these straight chain high molecular weight compounds should usually be in a range of from 5,000 to 100,000. With the molecular weight of below 5,000, no flexibility-imparting effect of the straight chain high molecular weight compound can be obtained. On the contrary, when the molecular weight exceeds 100,000, viscosity of the resin increases excessively with the consequence that impregnation of the resin into the base material becomes insufficient. The mixing quantity of this straight chain high molecular weight compound is in a range of from 1 to 60 parts by weight with respect to the composition (Ia) obtained by mixing the above-mentioned poly-functional epoxy resin ($\alpha_1$) and brominated bisphenol A ($\beta_1$), or the composition (Ib) obtained by mixing the above-mentioned poly-functional epoxy resin ($\alpha_2$) and phenolic resin ($\beta_2$). When the mixing quantity is below 1 part by weight, the flexibility-imparting effect of this straight chain high molecular weight compound is not sufficient. On the contrary, when the mixing quantity exceeds 60 parts by weight, the straight chain high molecular weight compound deposits, in some cases, at the time of curing. In addition, viscosity of the resin increases excessively, whereby impregnation of the resin into the base material becomes insufficient at the time of producing the prepreg for lamination.

(v) The poly-functional epoxy resin ($\alpha_1$) is as shown in the following chemical formula.

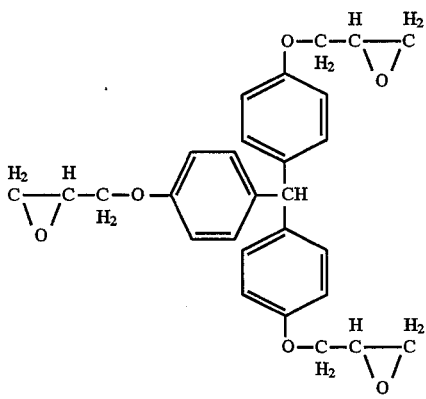

A brominated bisphenol A ($\beta_1$) for the oligomerization of the poly-functional epoxy resin ($\alpha_1$) of the present invention, there may be used, for example, monobrominated bisphenol A, dibrominated bisphenol A, and tetrabrominated bisphenol A.

For obtaining oligo-epoxy resin ($\alpha$) represented by the following chemical formula, the components are mixed and reacted in such a manner that the epoxy group in the above-mentioned poly-functional epoxy resin ($\alpha_1$) may be in a range of from 3 to 5 equivalents with respect to 1 equivalent of hydroxyl group in brominated bisphenol A ($\beta_1$).

be obtained, and, moreover, the low molecular weight phenolic resin remains in the laminated plate to decrease its mechanical properties, heat-resistance, and moisture-resistance. On the contrary, when the molecular weight of phenolic resin exceeds 10,000, reactivity with epoxy group becomes inferior. Therefore, in order to obtain the composition (I), the mixing quantity of phenolic resin should be such that the hydroxyl group in the phenolic resin ($\beta$) ranges from 0.7 to 1.2 equivalents with respect to 1 equivalent of the terminal epoxy group in the above-mentioned poly-functional epoxy resin. With the mixing quantity of the phenolic resin not reaching 0.7 equivalent of the hydroxyl group contained therein, unreacted epoxy group remains in the product with the consequent decrease in the heat-resistant property. On the other hand, when it exceeds 1.2 equivalent, there remains in the product the phenolic resin which did no take part in the reaction with the consequent deterioration in the moisture-resistance and the heat-resistance of the product.

As the straight chain high molecular weight compound ($\gamma$) for the purpose of the present invention there may be suitably used those compounds which are miscible with poly-functional epoxy resin ($\alpha_1$), brominated bisphenol A ($\beta_1$), oligo-epoxy resin ($\alpha$), and phenolic resin ($\beta$), such As polysulfone, polyethersulfone, polyester, phenoxy resin, and so forth. A preferred molecular weight of these straight chain high molecular weight compounds should usually be in a range of from 5,000 to 100,000. With the molecular weight of below 5,000, no flexibility-imparting effect of the straight chain high molecular weight compound can be obtained. On the contrary, when the molecular weight exceeds 100,000, viscosity of the resin increases excessively with the consequence that impregnation of the resin into the base material becomes insufficient. The mixing quantity of this straight chain high molecular weight compound is in a range of from 1 to 60 parts by weight with respect to the composition (I)

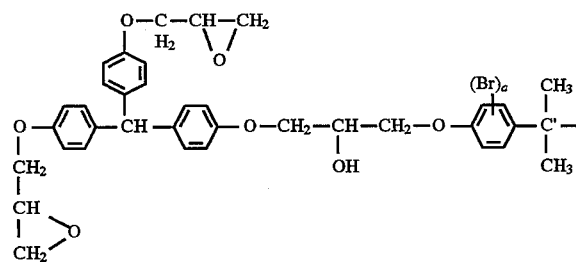 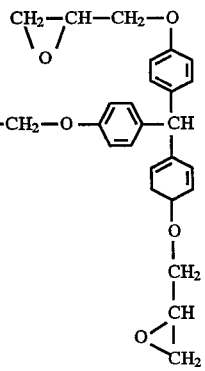

[where: a is an integer of from 1 to 4]

With the epoxy group of below 3 equivalents, excessive amount of hydroxyl group in the brominated bisphenol A ($\beta_1$) remains in the produced resin to deteriorate its stability. On the contrary, with the epoxy resin of 5 equivalent and above, excessive amount of poly-functional epoxy resin ($\beta_1$) remains in the cured product resin to impair its toughness.

Phenolic resin ($\beta$) according to the present invention is a poly-condensate of bisphenol A and formaldehyde, which is capable of preventing discoloration due to heat of a cured substance obtained by using other types of phenolic resin as the curing agent. This phenolic resin ($\beta$) has its molecular weight of from 1,000 to 10,000. With its molecular weight being below 1,000, no sufficient reactivity of the reactant can obtained by mixing the above-mentioned oligo-epoxy resin ($\alpha$) and phenolic resin ($\beta$). When the mixing quantity is below 1 part by weight, the flexibility-imparting effect of this straight chain high molecular weight compound is not sufficient. On the contrary, when the mixing quantity exceeds 60 parts by weight, the straight chain high molecular weight compound deposits, in some cases, at the time of curing. In addition, viscosity of the resin increases excessively, whereby impregnation of the resin into the base material becomes insufficient at the time of producing the prepreg for lamination.

(vi) As the poly-functional epoxy resin ($\alpha$) shown by the following general formula, there may be used, for example, TACTIX-742 (a tradename for a product of Dow Chemical Co.)., EPPN 502 a tradename for a product of Nihon Kayaku K. K.), and those other compounds synthesized by the present inventors as shown by the ensuing examples.

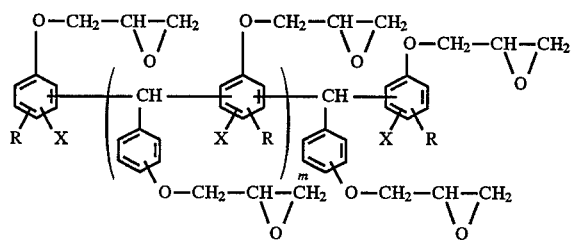

[where: R represents hydrogen or $CH_3$; X denotes hydrogen or Br; and m is an integer of from 0 to 5]

There is no particular limitation to the kind of phenolic resin for the purpose of the present invention. Examples of such phenolic resin are: phenol novolac resin such as, for example, PSF4261(a tradename for a product of Gun-Ei Chemical Co. Ltd.), YLH-129 (a tradename for a product of Yuka-Shell Co. Ltd.), PZ-6000 (a tradename for a product of Hitachi Kasei K. K.); cresol novolac resin; alkyl-modified phenol novolac resin; bisphenol A type phenol novolac resin; and so forth. These resins may be used singly or in a combination of two or more kinds thereof. In particular, as the phenolic resin to be used for the preliminary reaction with the epoxy group of a silicone compound containing the epoxy group therein, those having a softening point of from 60° C. to 110° C. are preferred.

As the straight chain high molecular weight compounds for the purpose of the present invention, there may be suitably employed polyparabanic acid, polyethersulfone, polysulfone, polyetherimide, polyphenylenesulfide, polyester, phenoxy resin, and so forth. A preferred molecular weight of these straight chain high molecular weight compounds should usually be in a range of from 5,000 to 100,000. With the molecular weight of below 5,000, no flexibility-imparting effect of the straight chain high molecular weight compound can be obtained. On the contrary, when the molecular weight exceeds 100,000, viscosity of the resin increases excessively with the consequence that impregnation of the compound into the base material becomes insufficient. The mixing quantity of this straight chain high molecular weight compound is in a range of from 1 to 100 parts by weight with respect to 100 parts by weight of the composition (A) or composition (X). When the mixing quantity is below 1 part by weight, the flexibility-imparting effect of this straight chain high molecular weight compound is not sufficient. On the contrary, when the mixing quantity exceeds 100 parts by weight, viscosity of the resin increases excessively, whereby impregnation of the resin into the base material becomes insufficient at the time of producing the prepreg for the laminated plate.

The mixing quantity f the above-mentioned polyfunctional epoxy resin and phenolic resin for obtaining the composition (I) should be such that the hydroxyl group in the phenolic resin ranges from 0.7 to 1.2, preferably 0.7 to 1.0 equivalents with respect to 1 equivalent of the terminal epoxy group in the above-mentioned poly-functional epoxy resin. With the mixing quantity of the phenolic resin not reaching 0.7 equivalent of the hydroxyl group contained therein, unreacted epoxy group remains in the product with the consequent decrease in the heat-resistant property. On the other hand, when it exceeds 1.2 equivalent, there remains in the product the phenolic resin which did not take part in the reaction with the consequent deterioration in the moisture-resistance and the heat-resistance of the product.

As the vinyl compound (II) according to the present invention, containing therein at least 2 vinyl groups in its molecule, there may be used, for example, trimethylolpropane triacrylate, trimethylolpropane trimethacrylate, triallyl trimellitate, trihydroxyethyl isocyanuric acid triacrylate, and trihydroxyethyl isocyanuric acid trimethacrylate. This vinyl group of at least two is essential for the cross-linking of the resin to be produced, the mixing quantity of which is in a range of from 5 to 100 parts by weight with respect to 100 parts by weight of the composition (I) obtained by mixing the above-mentioned polyfunctional epoxy resin and phenolic resin. With the mixing quantity of the vinyl compound of below 5 parts by weight, no sufficient flexibility-imparting effect is imparted to the produced resin. On the contrary, when the mixing quantity exceeds 100 parts by weight, its heat-resistant property becomes lowered.

The silicone-modified phenlic resin (β) is a product of the preliminary reaction of, for example, an epoxy-group-containing silicone compound and a phenolic resin, which is obtained by adding a phosphorus type compound or imidazoles, as the catalyst, to a mixture of the epoxy-group-containing silicone compound and the phenolic resin, and causing the mixture to react under the nitrogen atmosphere at a temperature ranging from 120° C. to 160° C. for a time period of from 5 to 30 hours. As the epoxy-group-containing silicone compound, there may be used any one having an epoxy group either at both ends of the molecule or in the middle of the molecular chain. Epoxy-modified polydimethylsiloxane having an epoxy group at both ends of the molecule is particularly favorable for producing a resin composition which is more excellent in its high temperature storage stability.

As the silicone compound containing an epoxy group at both ends of the molecule, those having an epoxy equivalent of 5,000 or below is suitable. When the epoxy equivalent is greater than 5,000, the molecular weight of the silicon oil component increases with the consequence that its miscibility with phenolic resin decreases, hence the reaction between the epoxy group in the silicone compound containing therein such epoxy group and the hydroxyl group in the phenolic resin tends to be insufficient.

As the silicone compound containing an epoxy group in the middle of the molecular chain, those having an epoxy equivalent of from 500 to 40,000 are preferable, or more particularly from 1,000 to 20,000 are preferable. Further, those having the number of an epoxy group in one molecule of from about 2 to 10, or more particularly about 4 to 8 are preferable. When the epoxy equivalent or the number of an epoxy group in one molecule are outside these ranges, the reaction between the silicone compound and the phenolic resin does not proceeds satisfactorily, in case the amount of an epoxy group is small; and the reaction product tends to be gelled, in case the amount of an epoxy group is large.

As the catalyst for the preliminary reaction between the epoxy-group-containing silicone compound and the phenolic resin, there may be used the phosphorus type compounds such as phosphines represented by triphenylphosphine; and imidazoles such as, in particular, 2-ethyl-4-methylimidazole, 2-methylimidazole-2-undecylimidazole, and 2-heptadecylimidazole.

In mixing the epoxy-group-containing silicone compound and the phenolic resin, it is preferred that the phenolic resin be mixed at a ratio of from 3 to 1,000 equivalents of the phenolic hydroxyl group per 1 equivalent of the terminal epoxy group in the epoxy-group-containing silicone compound, and in particular, when using the silicone compound having an epoxy group at both ends of the molecule, a ratio of from 3 to 100 equivalents is preferable. When the equivalent of a hydroxyl group in the phenolic resin is greater than 1,000 with respect to 1 equivalent of the terminal epoxy group in the epoxy-group-containing silicone compound, a ratio of the silicone oil component in the silicone-modified phenolic resin becomes low with the consequence that the effect of improvement in its adhesiveness with the glass base tends to be insufficiently exhibited. On the other hand, when the equivalent of a hydroxyl group in the phenolic resin is smaller than 3, gellation tends to occur during the preliminary reaction between the epoxy-group-containing silicone compound and the phenolic resin, whereby there is a tendency such that stabilized silicone-modified phenolic resin is difficult to obtain. The adding quantity of the catalyst to be used for the preliminary reaction of the epoxy-group-containing silicone compound and the phenolic resin should preferably be 0.3 part or below with respect to 100 parts of the silicone compound, in case the silicone compound contains the epoxy group, in the middle of the molecular chain. On the other hand, when use is made of the silicone compound containing the epoxy group at both ends of the molecule, the catalyst should preferably be 0.5 part or below with respect to 100 parts of the silicone compound.

The thus obtained silicone-modified phenolic resin as the product of the preliminary reaction between the epoxy-group-containing silicone compound and the phenolic resin should preferably be such that, at the stage of the preliminary reaction, 90% or more of the epoxy group in the silicone compound has been reacted with the hydroxyl group in the phenolic resin. In particular, when the ratio of reaction of the epoxy group in the silicone compound containing the epoxy group at both ends of the molecule with respect to the hydroxyl group in the phenolic resin is 90% or more, a desired resin composition is formed, thereby making it possible to reduce the degree of lowering strength in the resin composition, when it is stored over a long time at a high temperature. When the ratio of reaction is below 90%, the silicone compound having the epoxy group at both ends of the molecule remains in the final product, after the final curing, in the form of an unreacted substance, because of its slow reaction rate in comparison with the poly-functional epoxy resin ($\alpha$), whereby the resulted resin composition might in some cases possess lower moisture-resistance and mechanical strength.

cross-linking density becomes too high, and a mechanical strength becomes inferior. If the mixing ratio is below 1:9, the effect of improvement in the adhesiveness of the resulted composition, when it is shaped, with the glass base at a high temperature level is, in many case, not satisfactory. On the contrary, if the mixing ratio exceeds 8:2, there tends to possibly arise lowering in the glass transition point of the composition, or lowering in the mechanical strength to a considerable degree, or other disadvantages.

(vii) As the poly-functional epoxy resin ($\alpha_1$), which is represented by the following general formula, there may be used, for example, TACTIX-741 (a tradename for a product of Dow Chemical Co.), EPPN 502 (a tradename for a product of Nihon Kayaku K. K.), and those compounds which were synthesized by the present inventors as shown in the preferred examples of the present invention to be given later.

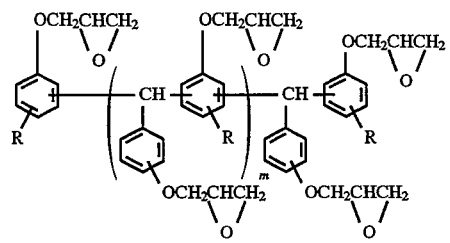

[where: R represents hydrogen or $CH_3$; and m is an integer of 0 to 5]

In the above general formula, m is an integer of from 0 to 5. When m exceeds 5, the resin increases its viscosity excessively with the consequence that its impregnation into the base material becomes insufficient at the time of producing the prepreg for the laminated plate.

Further, as the poly-functional epoxy resin ($\alpha_2$) shown by the following general formula, for the purpose of the present invention, there may be used, for example, EPIKOTE 828, EPIKOTE 1001, EPIKOTE 1004 (all being tradenames for products of Yuka-Shell Co. Ltd.), YD-115, YD-124 (both being tradenames for products of Toto Kasei K. K.), GY-260 (a tradename for a product of Ciba-Geigy A. G.), DR-331 (a tradename for a product of Dow Chemical Co.), and others.

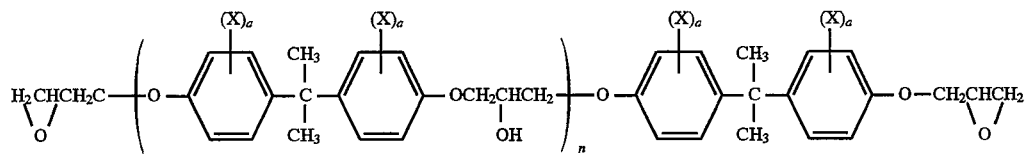

The mixing quantity of the silicone-modified phenolic resin ($\beta$) and the phenolic resin ($\beta'$) with respect to the poly-functional epoxy resin ($\alpha$) to obtain the composition (X) is such that the phenolic hydroxyl group in both silicone-modified phenolic resin ($\beta$) and the phenolic resin ($\beta'$) is 0.2–1.5 equivalents in total with respect to 1 equivalent of the epoxy group in the poly-functional epoxy resin ($\alpha$), and the mixing ratio of the above-mentioned silicone-modified phenolic resin ($\beta$) and the phenolic resin ($\beta'$) is in a range of from 1:9–8:2 at a mol ratio. If the amount of the phenolic hydroxyl group is less than 0.2 equivalent, a sufficient cross-linking density is not obtained and a heat-resistance becomes inferior. On the other hand, if the amount of the phenolic hydroxyl group is more than 1.5 equivalents, the

[where: n is an integer of 0 or above; X denotes bromine or hydrogen; and a is an integer of from 1 to 4]

The mixing ratio of the above-mentioned poly-functional epoxy resin ($\alpha_1$) and the bisphenol A type epoxy resin ($\alpha_2$) to obtain the composition ($\alpha$) according to the present invention is in a range of from 100:0 to 30:70 (by weight). When the bisphenol A type epoxy resin ($\alpha_2$) is mixed outside this range, the heat-resistant property of the resulting product resin becomes inferior.

Moreover, in order to obtain the poly-functional epoxy resin (A), the mixing ratio of the epoxy resin composition ($\alpha$) and the brominated bisphenol A ($\beta$) should be such that the hydroxyl group in the latter is in a range of from 0.05 to 0.5 equivalent with respect to 1 equivalent of the terminal epoxy group in the former, and that the ratio of reaction between the epoxy group and the hydroxyl group should be 80% or above.

If the equivalent ratio for the reaction is below 0.05, the above-mentioned poly-functional epoxy resin (A) cannot be obtained uniformly. On the contrary, if it exceeds 0.5 equivalent, unreacted hydroxyl group remains in the product to deteriorate reactivity. In the same way, the reactivity becomes inferior, when the ratio of reaction is below 80%.

For the reaction to obtain the poly-functional epoxy resin (A), there may, or may not, be used a catalyst. The catalyst for use may be selected from amines such as triethylamine, benzyldimethylamine, and so forth; imidazoles; phosphorus type compounds such as triphenylphosphine, etc. However, the catalyst useful for the purpose of the present invention is not limited to these compounds alone.

As the phenolic resin (B) according to the present invention, there may be used, for example, KP-756P (a tradename for a product of Arakawa Kagaku Kogyo K. K.), YLH-129 (a tradename for a product of Yuka-Shell Co. Ltd.), and those compounds which were synthesized by the present inventors as shown in the preferred examples of the present invention to be given later.

The weight average molecular weight of the above-mentioned phenolic resin (B) is in a range of from 1,000 to 10,000. With its weight average molecular weight of below 1,000, the resin is inferior in its toughness. On the contrary, when the weight average molecular weight exceeds 10,000, the resin increases its viscosity excessively with the consequence that its impregnation into the base material becomes insufficient at the time of producing the prepreg for the laminated plate.

The mixing quantity of the above-mentioned poly-functional epoxy resin (A) and the phenolic resin (B) for obtaining the composition (I) should be such that the hydroxyl group in the above-mentioned phenolic resin ranges from 0.7 to 1.2 equivalent with respect to 1 equivalent of the terminal epoxy group in the above-mentioned poly-functional epoxy resin. With the ratio of the hydroxyl group not reaching 0.7 equivalent, unreacted epoxy group remains in the product with the consequent decrease in the heat-resistant property. On the other hand, when it exceeds 1.2 equivalent, there remains in the product the phenolic resin which did not take part in the reaction with the consequent deterioration in the moisture-resistance and the heat-resistance of the product.

As the straight chain high molecular weight compound (γ) for the purpose of the present invention, there may be suitably used polyparabanic acid, polyethersulfone, polysulfone, polyetherimide, polyphenylenesulfide, phenoxy resin, and, moreover, liquid crystal polymers such as total aromatic polyester, etc. A preferred molecular weight of these straight chain high molecular weight compounds should usually be greater than 5,000. With the molecular weight of below 5,000, no flexibility-imparting effect of the straight chain high molecular weight compound can be obtained. On the contrary, when the molecular weight exceeds 100,000, viscosity of the resin increases excessively with the consequence that impregnation of the resin into the base material becomes insufficient. The mixing quantity of this straight chain high molecular weight compound is in a range of from 1 to 60 parts by weight with respect to the above-mentioned composition (I). When the mixing quantity is below 1 part by weight, the flexibility-imparting effect of this straight chain high molecular weight compound is not sufficient. On the contrary, when the mixing quantity exceeds 60 parts by weight, the resin increases its viscosity excessively, with the consequence that impregnation of the resin into the base material becomes insufficient at the time of producing the prepreg for lamination.

(viii) As the polyfunctional epoxy resin (α), which is represented by the following general formula, there may be used, for example, TACTIX-742 (a tradename for a product of Dow Chemical Co.), EPPN-502 (a tradename for a product of Nihon Kayaku K. K.), and those compounds which were synthesized by the present inventors, as will be given in the ensuing examples.

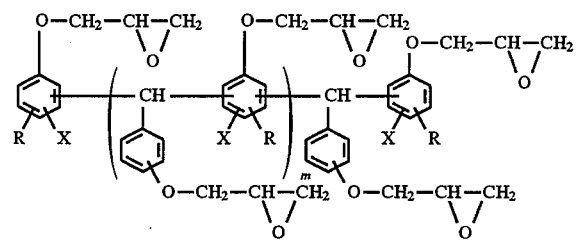

[where: R represents hydrogen or $CH_3$; X denotes hydrogen or Br; and m is an integer of from 0 to 5].

In the above general formula, m is an integer of from 0 to 5. When m exceeds 5, the resin increases its viscosity excessively with the consequence that its impregnation into the base material becomes insufficient at the time of producing the prepreg for the laminated plate.

In order to obtain the poly-functional epoxy resin (A) according to the present invention, the mixing quantity of the above-mentioned polyfunctional epoxy resin (α) and a composition (β) obtained by mixing at least one kind of brominated bisphenol A ($\beta_1$) and bisphenol A ($\beta_2$) should be such that the hydroxyl group in the composition (β) should be in a range of from 0.05 to 0.5 equivalent with respect to 1 equivalent of the terminal epoxy group in the poly-functional epoxy resin (α), and that the ratio of reaction between the epoxy group and the hydroxy group should be 80% or above. If the equivalent ratio for the reaction is below 0.05, the above-mentioned poly-functional epoxy resin (A) cannot be obtained uniformly. On the other hand, when the ratio exceeds 0.5 equivalent, unreacted hydroxyl group remains in the resulting product, hence the reactivity becomes inferior. In the same way, when the ratio of reaction is below 80%, the reactivity becomes inferior.

It should be noted that, for the reaction to obtain the poly-functional epoxy resin (A), there may, or may not, be used a catalyst. For the catalyst to be used, there may be exemplified amines such as triethylamine, benzylmethylamine, etc.; imidazoles; and phosphorus type compounds such as triphenylphosphine, etc., although the catalyst is not limited to these compounds alone.

As the phenolic resin (B) according to the present invention, there may be used, for example, KP-756P (a tradename for a product of Arakawa Kagaku Kogyo K. K.), YLH-129 (a tradename for a product of Yuka-Shell Co.), and those compounds which were synthesized by the present inventors, as will be given in the ensuing examples.

It should be noted that the weight average molecular weight of the above-mentioned phenolic resin (B) is in a range of from 1,000 to 10,000. When the weight average molecular weight does not reach 1,000, the resin is inferior in its toughness. On the contrary, when it exceeds 10,000, the resin increases its viscosity excessively with the consequence that impregnation of the resin into the base material becomes insufficient at the time of producing the prepreg for the laminated plate.

The mixing quantity of the above-mentioned poly-functional epoxy resin (A) and the phenolic resin (B) to obtain the composition (I) according to the present invention is such that the hydroxyl group in the phenolic resin is in a range of from 0.7 to 1.2 equivalents with respect to 1 equivalent of the terminal epoxy group. When the ratio does not reach 0.7 equivalent, unreacted epoxy group remains in the resulting product, hence its heat-resistant property becomes inferior. On the contrary, when the ratio exceeds 1.2 equivalents, the phenolic resin which did not take part in the reaction remains in the resulting product, whereby its moisture-resistant property and heat-resistant property becomes inferior.

As the straight chain high molecular weight compound ($\gamma$) according to the present invention, there may suitably be used polyparabanic acid, polyethersulfone, polysulfone, polyetherimide, polyphenylenesulfide, phenoxy resin, and, moreover, liquid crystal polymers such as total aromatic polyester, and so forth. A preferred molecular weight of this straight chain high molecular weight compound should usually be 5,000 or above. When the molecular weight does not reach 5,000, no flexibility-imparting effect by this straight chain high molecular weight compound can be obtained. On the other hand, when the molecular weight exceeds 100,000, the compound increases its viscosity excessively with the consequence that its impregnation into the base material becomes insufficient. The mixing quantity of this straight chain high molecular weight compound is in a range of from 1 to 60 parts by weight with respect to the above-mentioned composition (I). When the mixing quantity is below 1 part by weight, the flexibility-imparting effect of this high molecular weight compound is not sufficient. On the contrary, when its mixing quantity exceeds 60 parts by weight, the resin increases its viscosity excessively with the result that its impregnation into the base material becomes insufficient at the time of producing the prepreg for the laminated plate.

In order to accelerate the curing reaction, the resin composition for the laminated plate according to the present invention, as has so far been described in he foregoing, may contain therein aromatic amines, phosphorus type compounds, imidazoles, and imidazolines. Representative examples thereof are: benzyldimethylamine, triphenylphosphine, imidazole, 2-methylimidazole, 2-ethylimidazole, 2-ethyl-4-methylimidazole, 2-phenylimidazole, 2-undecylimidazole, 1-benxyl-2-methylimidazole, 2-heptadecylimidazole, 4,5-diphenylimidazole, 2-methylimidazoline, 2-ethyl-4-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazole, 2-phenyl-4-methylimidazoline, and so forth.

A plurality of kinds of these curing accelerators may be combined, the mixing quantity of which should be in a range of from 0.01 to 5 parts by weight with respect to 100 parts by weight of the poly-functional epoxy resin ($\alpha$), or preferably in a range of from 0.01 to 0.5 part by weight, or more preferably from 0.01 to 0.3 part by weight. When the mixing quantity is below 0.01 part by weight, the effect of its inclusion is small such that the rate of reaction is slow and that fluidity of the resin is difficult to control, when producing the prepreg for the laminated plate. On the contrary, when the mixing quantity is greater than 5 parts by weight, the storage stability of the resin composition is impaired, whereby the pot life of the prepreg for the laminated plate becomes shorter.

The thus obtained resin composition for the laminated plate is usually dissolved in any of the below-listed solvents, and used for production of the prepreg in the form of a resin liquid having a predetermined concentration.

As the solvent, there may be suitably used alcohols such as ethyl alcohol, propyl alcohol, butyl alcohol, and so forth; aromatic hydrocarbons such as benzene, toluene, xylene, and so on; ketones such as acetone, methyethylketone, methylisobutylketone, cyclohexanone, and so on; ethers of ethyleneglycols or diethyleneglycols such as ethyleneglycol monomethylether, ethyleneglycol monoethylether, diethyleneglycol monomethylether, ethyleneglycol monoethyletheracetate, and the like, and their acetic acid esters; and various others. Besides these solvents, there may also be used amides such as N,N-dimethylformamide, N,N-dimethylacetamide, and so on; and polar solvents such as N-methylpyrrolidone, dimethylsulfoxide, and so forth. These solvents may be used singly or in a combination of two or more kinds of them.

As already mentioned in the foregoing, the copper-lined laminated plate is obtained by applying the above described resin composition for laminated plate onto a predetermined base material, impregnating the base material with the resin composition, then drying the resin-impregnated base material to produce a prepreg, and thereafter laying a copper foil onto this prepreg, followed by pressing the combination under heat.

The base material which can be used for the purpose of the present invention is generally glass fibers. Besides this, there may also be used aromatic polyamide fibers, and further glass, polyester, aromatic polyamide, etc. in the form of mat.

The resin composition for laminate is usually applied onto the base material, and then dried at a temperature ranging from 80° C. to 200° C. for a time period of from 1 min. to 20 min., thereby making it into a prepreg. The thus obtained prepreg is laminated for a required number of sheets, and then a copper foil is laid over on at least one surface thereof, in which state the combination is usually heated at a temperature ranging from 80° C. to 250° C., under a pressure ranging from 5 kg/cm$^2$ to 100 kg/cm$^2$, for a time period of from 10 min. to 300 min., thereby obtaining the copper-lined laminate. It should be understood that the conditions as shown above are preferred parameters, but the invention is not limited to such conditions alone.

The laminated plates to be obtained by use of various resin compositions according to the present invention, as given in the preferred examples thereof, are excellent in their heat-resistance solder heat-resistance, electrical characteristics, and-mechanical characteristics, and may suitably be used for high density multi-lamination.

In the following, the present invention will be explained in more detail with reference to various preferred examples.

EXAMPLE 1

Tetrabromo-bisphenol A and bisphenol A were mixed at a molar ratio of 2:1, into which 37% conc. formaline and oxalic acid were added to subject the mixture to reaction under heat. Thereafter, the reaction product was dehydrated to concentrate, thereby obtaining brominated bisphenol A novolac resin. To this resin, there was added epichlorohydrin and tetraethyl ammonium chloride were added to subject the batch to reaction under heat, after which further reaction was carried out with addition of NaOH, whereby the poly-functional epoxy resin having a molecular weight of 2,500 and represented by the following formula was obtained.

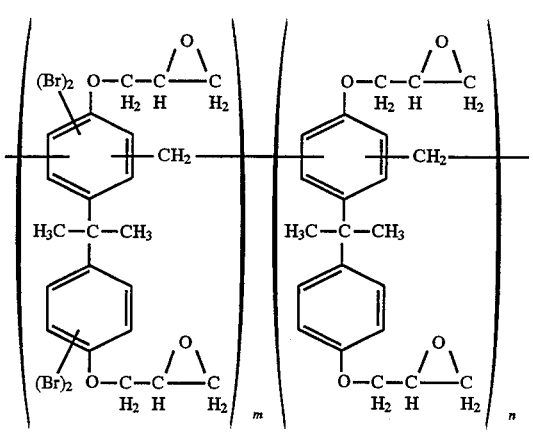

[wherein m/n=2]

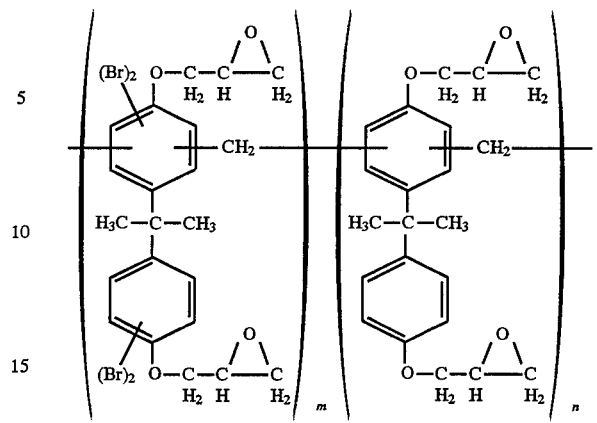

[where: m/n=1]

To a composition obtained by mixing 100 g of the poly-functional epoxy resin represented by the above chemical formula and 41 g of phenolic resin (molecular weight of 3,500) produced by poly-condensation of bisphenol A and formaldehyde (an equivalent ratio of the phenolic hydroxyl group to the epoxy group being 0.95), there were mixed 46 g of phenoxy resin having a weight average molecular weight of 65,000 ("PKHH", a tradename for a product of Union Carbide Corporation) and 0.1 g of 2-ethyl-4-methylimidazole. The mixture was then dissolved into 125 g of ethyleneglycol monomethylether, thereby obtaining a 60% conc. resin composition for laminated plate, according to one example of the present invention.

This resin composition was impregnated into woven fabric of glass having a thickness of 0.18 mm, followed by drying the impregnated resin composition. As the result, there was obtained a prepreg with a resin content of 48% by weight. Four sheets of this prepreg were laminated, and then copper foils of 35 μm thick each were placed on both surfaces of the laminated prepreg, followed by press-shaping the combination. The shaping was done under the conditions of a pressing temperature of 190° C., a compression of 40 kg/cm², and a pressing time of 60 mins.

Table 1 below shows the results of evaluation of the physical and electrical properties of the copper-lined laminate obtained in the above described manner.

EXAMPLE 2

The poly-functional epoxy resin having a molecular weight of 1,800, as represented by the following formula, was obtained by the same reaction as in Example 1 above, with the exception that tetrabromo-bisphenol A and bisphenol A were mixed at a molar ratio of 1:1.

To a composition obtained by mixing 100 g of the poly-functional epoxy resin represented by the above chemical formula and 33 g of phenolic resin (weight average molecular weight of 1,500) produced by poly-condensation of bisphenol A and formaldehyde (an equivalent ratio of the phenolic hydroxyl group to the epoxy group being 0.7), there were mixed 95 g of polyester resin having a molecular weight of 15,000 ("BYRON200", a tradename for a product of Toyo Boseki K. K.) and 0.2 g of 2-phenylimidazoe. The mixture was then dissolved into 100 g of methylethylketone and 87 g of ethyleneglycol monomethylether, thereby obtaining a 55% conc. resin composition for laminated plate, according to another example of the present invention.

This resin composition was impregnated into woven fabric of glass having a thickness of 0.18 mm, followed by drying the impregnated resin composition. As the result, there was obtained a prepreg with a resin content of 52% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 60 min. of a pressing time.

Table 1 below shows the results of evaluation of the physical and electrical properties of the copper-lined laminate obtained in the above described manner.

EXAMPLE 3

The poly-functional epoxy resin having a molecular weight of 3,000, as represented by the following chemical formula, was obtained by the same reaction as in Example 1 above, with the exception that tetrabromo-bisphenol A and bisphenol A were mixed at a molar ratio of 5:1.

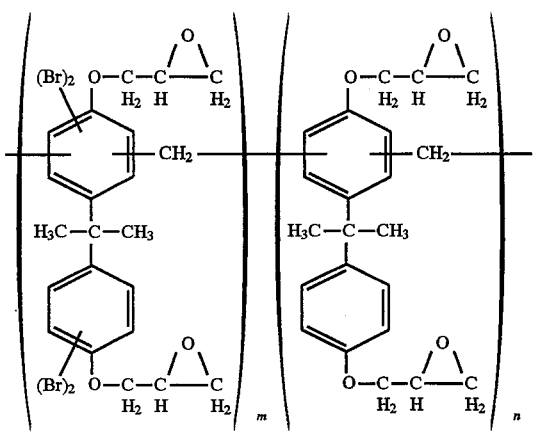

[where: m/n=5]

To a composition obtained by mixing 100 g of the poly-functional epoxy resin represented by the above chemical formula and 43 g of phenolic resin (weight average molecular weight of 3,500) produced by poly-condensation of bisphenol A and formaldehyde (an equivalent ratio of the phenolic hydroxyl group to the epoxy group being 1.1), there were mixed 8 g of polysulfone resin ("P-170", a tradename for a product of AMOCO) and 0.12 g of 2-ethyl-4-methylimidazol. Then, the mixture was dissolved into 30 g of acetone and 59 g of methylethylketone, thereby obtaining a 63% conc. resin composition for laminated plate, according to still another example of the present invention.

This resin composition was impregnated into woven fabric of glass having a thickness of 0.18 mm, followed by drying the impregnated resin composition. As the result, there was obtained a prepreg with a resin content of 55% by weight. Four sheets of this prepreg were laminated, and then copper foils of 35 μm thick each were placed onto both surfaces of the laminated prepreg, followed by press-shaping the combination. The shaping was done under the conditions of 200° C. of a pressing temperature, 30 kg/cm² of a compression, and 90 min. of a pressing time.

Table 1 below shows the results of evaluation of the physical and electrical properties of the copper-lined laminate obtained in the above described manner.

EXAMPLE 4

Brominated bisphenol A novolac resin was obtained by reacting, under heat, tetrabromo-bisphenol A, 37% conc. formaline and oxalic acid, followed by dehydration and concentration of the reaction product. The epoxidation reaction was carried out by the same reaction as in Example 1 above, from which the poly-functional epoxy resin having a molecular weight of 2,500, as represented by the following chemical formula was obtained.

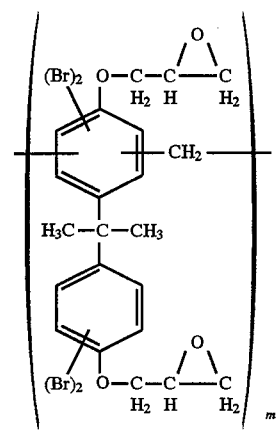

[where: m is 9]

To a composition obtained by mixing 100 g of the poly-functional epoxy resin represented by the above chemical formula and 33 g of phenolic resin (weight average molecular weight of 6,000) produced by poly-condensation of bisphenol A and formaldehyde (an equivalent ratio of the phenolic hydroxyl group to the epoxy group being 0.9), there were mixed 29 g of phenoxy resin ("YP-50", a tradename for a product of Tohto Kasei K. K.) and 0.23 g of 2-ethylimidazoline. Then, the mixture was dissolved into 30 g of N,N'-dimethylacetamide and 87 g of ethyleneglycol monomethylether, thereby obtaining a 58% conc. resin composition for laminated plate, according to other example of the present invention.

This resin composition was impregnated into woven fabric of glass having a thickness of 0.18 mm, followed by drying the impregnated resin composition. As the result, there was obtained a prepreg with a resin content of 51% by weight. Four sheets of this prepreg were laminated, and then copper foils of 35 μm thick each were placed onto both surfaces of the laminated prepreg, followed by press-shaping the combination.

The shaping was done under the same conditions as in Example 2 above. Table 1 below shows the results of evaluation of the various properties of the copper-lined laminate obtained in the above-described manner.

COMPARATIVE EXAMPLE 1

A copper-lined laminated plate was obtained in the same manner as in Example 1 above with the exception that, in place of phenoxy resin having a weight average molecular weight of 50,000 used in Example 1, epoxy resin having a molecular weight of 1,000 ("EPIKOTE 1001", a tradename for a product of Yuka-Shell Co. Ltd.).

COMPARATIVE EXAMPLE 2

A copper-lined laminated plate was obtained in the same manner as in Example 1 above with the exception that phenoxy resin as used in Example 1, which is the straight chain high molecular weight compound, was not mixed.

COMPARATIVE EXAMPLE 3

A copper-lined laminated plate was obtained in the same manner as in Example 2 above with the exception that polyester resin was used in a quantity of 120 g, instead of 95 g as used in Example 2.

Table 1 below indicates the result of evaluation of various properties of the copper-lined laminated plates obtained in Comparative Examples 1 to 3 above.

Table 2 below shows the results of evaluation of the physical and electrical properties of the copper-lined laminate obtained in the above-described manner.

TABLE 1

EVALUATIONS OF COPPER-LINED LAMINATED PLATE

| Particulars | Example 1 | Example 2 | Example 3 | Example 4 | Comparative Example 2 | Comparative Example 3 |
|---|---|---|---|---|---|---|
| Solder Heat-Resistance (sec, 260° C.) | >300 | >300 | >300 | >300 | 280 | 260 |
| Adhesive Strength of Copper Foils (kg/cm, at 200° C.) | 1.8 | 2.0 | 1.5 | 1.6 | 1.2 | 1.0 |
| Dielectric Resistance ($\Omega$) | $2.5 \times 10^{15}$ | $1.9 \times 10^{15}$ | $2.8 \times 10^{15}$ | $2.0 \times 10^{15}$ | $2.7 \times 10^{15}$ | $1.3 \times 10^{15}$ |
| Water Absorption (%) | 0.12 | 0.15 | 0.16 | 0.12 | 0.11 | 0.31 |
| Thermal Expansion Coefficient ($10^{-6}/°C.$) | 46 | 51 | 41 | 48 | 40 | 80 |
| Bending Strength (kg/mm²) | 64 | 62 | 64 | 61 | 49 | 42 |
| Thermal Deformation Temperature (°C.) | 212 | 201 | 215 | 208 | 213 | 168 |

Note:
1) Solder heat-resistance, adhesive strength of copper foil, dielectric resistance, and water absorption are in accordance with JIS C-6481.
2) Thermal expansion coefficient, bending strength, and heat-deformation temperature are in accordance with JIS K-6911.

As is apparent from Table 1 above, the resin compositions for laminated plate according to the preceding examples of the present invention, in their cured state, are excellent in their heat-resistant property, mechanical strength, and toughness in comparison with the resin compositions of the comparative examples, which are found to exhibit excellent adhesiveness, when used as the copper-lined laminate.

EXAMPLE 5

To 100 g of a composition obtained by mixing 65 g of the poly-functional epoxy resin ("TACTIX-742", a tradename for a product of Dow Chemical Co.), as represented by the following chemical formula and 35 g of phenolic resin ("PSF-4261" a tradename for a product of Gun-Ei Kagaku K. K.) (an equivalent ratio of the phenolic hydroxyl group to the epoxy group: 0.7), there were mixed 15 g of polyparabanic acid ("XT-4", a tradename for a product of Tohnen Petroleum Co. Ltd.) and 0.1 g of 2-ethyl-4-methylimidazol.

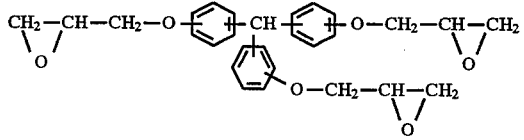

Then, the mixture was dissolved into 50 g of ethyleneglycol monomethylether and 30 g of cyclohexanone, thereby obtaining a 59% conc. resin composition for laminated plate, according to one example of the present invention.

This resin composition was impregnated into woven fabric of glass having a thickness of 0.18 mm, followed by drying the impregnated resin composition. As the result, there was obtained a prepreg with a resin content of 50% by weight. Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 90 min. of a pressing time.

EXAMPLE 6

To 100 g of a composition (I) obtained by mixing 57 g of the poly-functional epoxy resin ("EPPN 502", a tradename for a product of Nihon Kayaku K. K.), as represented by the following chemical formula and 43 g of phenolic resin ("PZ-6000" a tradename for a product of Hitachi Kasei K. K.) (an equivalent ratio of the phenolic hydroxyl group to the epoxy group: 0.95), there were mixed 10 g of phenoxy resin ("PKHH", a tradename for a product of Union Carbide Corp.) having a molecular weight of 30,000 and 0.1 g of 2-ethyl-4-methylimidazol.

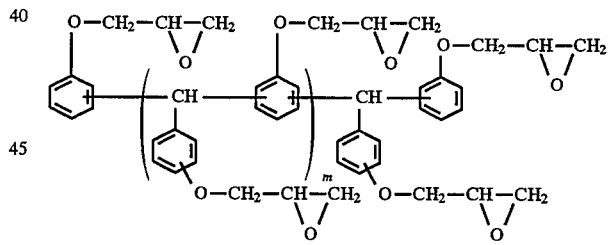

[where: m=1]

Then, the mixture was dissolved into 80 g of ethyleneglycol monomethylether, thereby obtaining a 58% conc. resin composition for laminated plate, according to another example of the present invention.

This resin composition was impregnated into woven fabric of glass having a thickness of 0.18 mm, followed by drying the impregnated resin composition. As the result, there was obtained a prepreg with a resin content of 50% by weight. Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 90 min. of a pressing time.

Table 2 below shows the results of evaluation of the physical and electrical properties of the copper-lined laminate obtained in the above-described manner.

EXAMPLE 7

To 100 g of a composition (I) obtained by mixing 71 g of the poly-functional epoxy resin represented by the following chemical formula and 29 g of phenolic resin ("YHL-129" a tradename for a product of Yuka-Shell Co. Ltd.), there were mixed 15 g of polyester sulfone ("VICTOREX", a tradename for a product of I.C.I. Japan) and 0.1 g of 2-ethyl-4-methylimidazol.

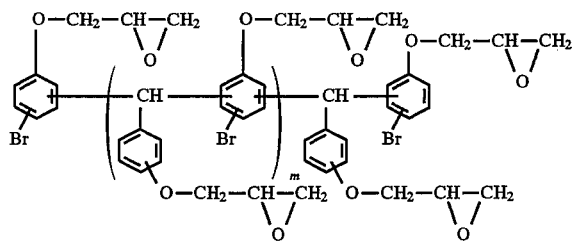

[where: m=3]

Then, the mixture was dissolved into 50 g of ethyleneglycol monomethylether and 30 g of N,N-dimethylformamide, thereby obtaining a 59% conc. resin composition for laminated plate, according to still another example of the present invention.

The poly-functional epoxy resin as represented by the above formula was obtained by the following procedures: first of all, 384 parts of parabromophenol and 61 parts of salicylaldehyde were reacted, in the presence of 0.3 part of concentrated hydrochloric acid, at a temperature of 100° C. for 30 minutes; thereafter, 0.5 part of p-toluenesulfonic acid was added to the reaction product to subject the batch to further reaction at 180° C. for two hours, thereby obtaining polyphenol represented by the following formula;

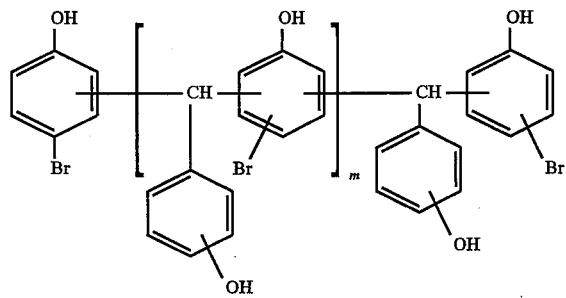

[where: m=3] and then 110 parts of this polyphenol and 740 parts of epichlorohydrin were reacted in accordance with the ordinary process.

This resin composition was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm$^2$ of a compression, and 90 min. of a pressing time.

Table 2 below shows the results of evaluation of the physical and electrical properties of the copper-lined laminate obtained in the above-described manner.

EXAMPLE 8

To 100 g of a composition (I) obtained by mixing 64 g of the poly-functional epoxy resin ("EPPN 502", a tradename for a product of Nihon Kayaku K. K.) represented by the following chemical formula and 36 g of bisphenol A novolac type phenolic resin, there were mixed 10 g of phenoxy resin ("PKHH", a tradename for a product of Union Carbide Corp.) and 0.1 g of 2-ethyl-4-methylimidazol.

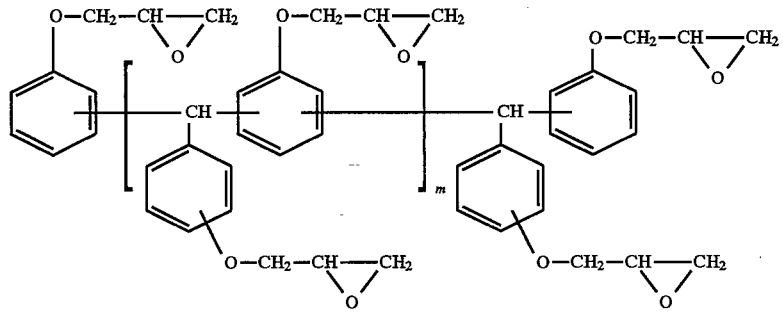

[where: m=1]

Then, the mixture was dissolved into 80 g of ethyleneglycol monomethylether, thereby obtaining a 58% conc. resin composition for laminated plate, according to other example of the present invention.

The above-mentioned bisphenol A novolac type phenolic resin was obtained by reacting 100 parts of bisphenol A, 22 parts of 37% conc. formaldehyde, and 1 part of oxalic acid in a flask equipped with a cooling tube and an agitator, in refluxing the reactant for two hours, and thereafter by concentrating the reaction product by dehydration.

This resin composition was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm$^2$ of a compression, and 90 min. of a pressing time.

Table 2 below shows the results of evaluation of the physical and electrical properties of the copper-lined laminate obtained in the above-described manner.

EXAMPLE 9

To 100 g of a composition (I) obtained by mixing 65 g of the poly-functional epoxy resin ("TACTIX-742", a tradename for a product of Dow Chemical Co.) represented by the following chemical formula and 35 g of phenolic resin ("PSF-4261", a tradename for a product of Gun-Ei Kagaku Co. Ltd.) having an equivalent ratio of the phenolic hydroxyl group to the epoxy group of 0.7, there were mixed 100 g of an imide composition (B) obtained by reacting 4,4'-bismaleimide diphenylmethane and diaminodiphenylether in dioxane solvent, at a molar ratio of 1:0.7, and at a temperature of 80° C. for three hours, 35 g of phenoxy resin (A) having a molecular weight of 50,000, and 0.1 g of 2-ethyl-4-methylimidazol.

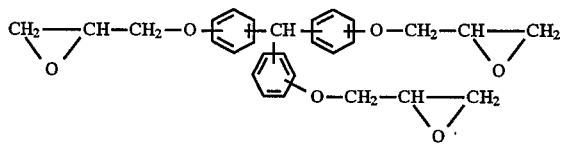

Then, the mixture was dissolved into 133 g of ethyleneglycol monomethylether, thereby obtaining a 60 wt % conc. resin composition for laminated plate, according to still other example of the present invention.

This resin composition was impregnated into woven fabric of glass having a thickness of 0.18 mm, followed by drying the impregnated resin composition. As the result, there was obtained a prepreg with a resin content of 48% by weight.

Four sheets of this prepreg were laminated, and then copper foils of 35 μm thick each were placed onto both surfaces of the laminated prepreg, followed by press-shaping the combination. The shaping was done under the conditions of 190° C. of a pressing temperature, 40 kg/cm² of a compression, and 60 min. of a pressing time.

Table 2 below shows the results of evaluation of the physical and electrical properties of the copper-lined laminate obtained in the above-described manner.

EXAMPLE 10

To 100 g of a composition (I) obtained by mixing 62 g of the poly-functional epoxy resin ("EPPN-502", a tradename for a product of Nihon Kayaku K. K.) represented by the following chemical formula and 38 g of phenolic resin ("PSF-4261", a tradename for a product of Gun-Ei Kagaku Co. Ltd.) having an equivalent ratio of the phenolic hydroxyl group to the epoxy group of 1.0, there were mixed 10 g of an imide composition (B) obtained by reacting 4,4'-bismaleimide diphenylether and diaminodiphenylmethane in dioxane solvent, at a molar ratio of 1:0.3, and at a temperature of 60° C. for two hours, 50 g of polystyrene (A) having a molecular weight of 15,000, and 0.1 g of 2-ethyl-4-methylimidazol.

[where: m=1]

Then, the mixture was dissolved into 73 g of ethyleneglycol monomethylether, thereby obtaining a 60 wt % conc. resin composition for laminated plate, according to further examplel of the present invention.

This resin composition was impregnated into woven fabric of glass having a thickness of 0.18 mm, followed by drying the impregnated resin composition. As the result, there was obtained a prepreg with a resin content of 52% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 60 min. of a pressing time.

Table 2 below shows the results of evaluation of the physical and electrical properties of the copper-lined laminate obtained in the above-described manner.

EXAMPLE 11

To 100 g of a composition (I) obtained by mixing 64 g of the poly-functional epoxy resin ("TACTIX-742", a tradename for a product of Dow Chemical Co.) and 36 g of phenolic resin ("YLH-129", a tradename for a product of Yuka-Shell Co. Ltd.) having an equivalent ratio of the phenolic hydroxyl group to the epoxy group of 0.7, there were mixed 150 g of an imide composition (B) obtained by reacting 4,4'-bismaleimide diphenylether and diaminodiphenylmethane in dioxane solvent, at a molar ratio of 1:1, and at a temperature of 100° C. for two hours, 35 g of phenoxy resin (A) having a weight average molecular weight of 50,000, and 0.15 g of 2-methylimidazol. Then, the mixture was dissolved into 150 g of methylethylketone and 55 g of N,N-dimethylacetamide, thereby obtaining a 55 wt % conc. resin composition for laminated plate, according to still further example of the present invention.

This resin composition was impregnated into woven fabric of glass having a thickness of 0.18 mm, followed by drying the impregnated resin composition. As the result, there was obtained a prepreg with a resin content of 46% by weight.

Four sheets of this prepreg were laminated, and then copper foils of 35 μm thick each were placed onto both surfaces of the laminated prepreg, followed by press-shaping the combination. The shaping was done under the conditions of 200° C. of a pressing temperature, 30 kg/cm² of a compression, and 90 min. of a pressing time.

Table 2 below shows the results of evaluation of the physical and electrical properties of the copper-lined laminate obtained in the above-described manner.

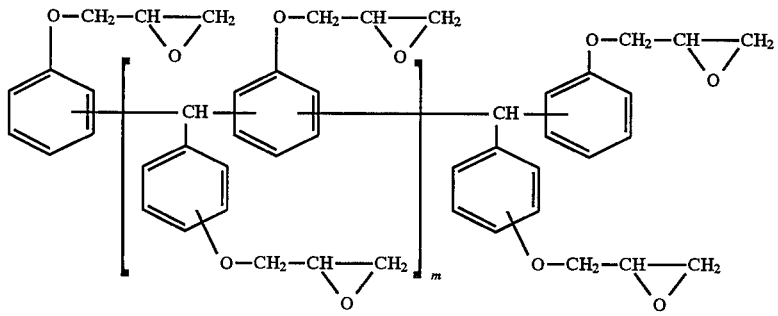

EXAMPLE 12

To 100 g of a composition (I) obtained by mixing 74 g of the poly-functional epoxy resin ("YL-6046", a tradename for a product of Yuka-Shell Co. Ltd.) represented by the following chemical formula and 26 g of phenolic resin ("PZ-6000", a tradename for a product of Hitachi Kasei K. K.) having an equivalent ratio of the phenolic hydroxyl group to the epoxy group of 0.8, there were mixed 200 g of bismaleimide triazine resin ("BT-2077", a tradename for a product of Mitsubishi Gas Kagaku K. K.) (B), 85 g of polyparabanic acid (A), and 0.2 g of 2-methylimidazoline.

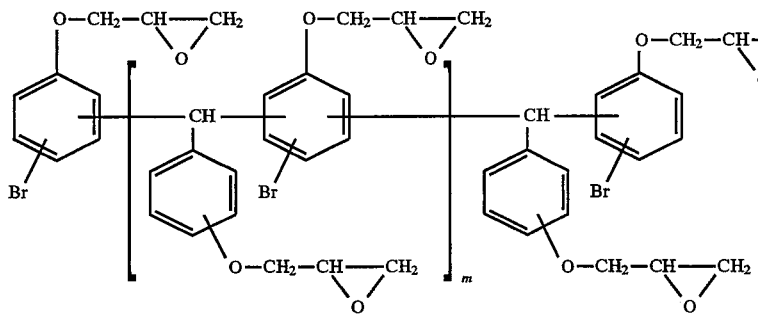
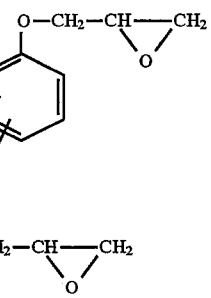

[where: m=1]

Then, the mixture was dissolved into 62 g of methylethylketone and 100 g of N,N-dimethylformamide, thereby obtaining a 65 wt % conc. resin composition for laminated plate, according to additional example of the present invention.

This resin composition was impregnated into woven fabric of glass having a thickness of 0.18 mm, followed by drying the impregnated resin composition. As the result, there was obtained a prepreg with a resin content of 53% by weight. The shaping was done under the same conditions as in Example 3 above.

Table 2 below shows the results of evaluation of various properties of the thus copper-lined laminate.

EXAMPLE 13

To 100 g of a composition (I) obtained by mixing 57 g of the poly-functional epoxy resin ("EPPN-502", a tradename for a product of Nihon Kayaku K. K.) and 43 g of phenolic resin ("PZ-6000", a tradename for a product of Hitachi Kasei K. K.) having an equivalent ratio of the phenolic hydroxyl group to the epoxy group of 0.95, there were mixed 50 g of an imide composition (B) obtained by reacting 3,3'-bismaleimide diphenylmethane and dibromodiaminodiphenylmethane in tetrahydrofuran solvent, at a molar ratio of 1:0.7, and at a temperature of 60° C. for three hours, 10 g of polyphenylenesulfide (A), and 0.15 g of 2-ethyl-4-methylimidazoline. Then, the mixture was dissolved into 150 g of methylethylketone, thereby obtaining a 50 wt % conc. resin composition for laminated plate, according to still additional example of the present invention.

This resin composition was impregnated into woven fabric of glass having a thickness of 0.18 mm, followed by drying the impregnated resin composition. As the result, there was obtained a prepreg with a resin content of 43% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 60 min. of a pressing time.

Table 2 below shows the results of evaluation of the physical and electrical properties of the copper-lined laminate obtained in the above-described manner.

EXAMPLE 14

To 100 g of a composition (I) obtained by mixing 71 g of the poly-functional epoxy resin ("YL-6046", a tradename for a product of Yuka-Shell Co. Ltd.) and 29 g of phenolic resin ("YLH-129", a tradename for a product of Yuka-Shell Co. Ltd.) having an equivalent ratio of the phenolic hydroxyl group to the epoxy group of 0.9, there were mixed 80 g of bismaleimide triazine resin ("BT-3104", a tradename for a product of Mitsubishi Gas Kagaku K. K.), 50 g of polyethersulfone (A), and 0.15 g of 1-benzyl-2-methylimidazole. Then, the mixture was dissolved into 100 g of methylethylketone, and 30 g of methylisobutylketone, thereby obtaining a 58 wt % conc. resin composition for laminated plate, according to still additional example of the present invention.

This resin composition was impregnated into woven fabric of glass having a thickness of 0.18 mm, followed by drying the impregnated resin composition. As the result, there was obtained a prepreg with a resin content of 51% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 90 min. of a pressing time.

Table 2 below shows the results of evaluation of the physical and electrical properties of the copper-lined laminate obtained in the above-described manner.

EXAMPLE 15

To 100 g of a composition (A) obtained by mixing 65 g of the poly-functional epoxy resin ("TACTIX-742", a tradename for a product of Dow Chemical Co. Ltd.) represented by the following chemical formula and 35 g of polyphenol compound ("PSF-4261", a tradename for a product of Gun-Ei Kagaku Co. Ltd.) having an equivalent ratio of the phenolic hydroxyl group to the epoxy group of 0.7, there were mixed 100 g of an imide composition (B) obtained by reacting 4,4'-bismaleimide diphenylmethane and diaminodiphenylether in dioxane solvent, at a molar ratio of 1:0.7, and at a temperature of 80° C. for three hours, 35 g of phenoxy resin having a molecular weight of 50,000, and 0.1 g of 2ethyl 4-methylimidazol.

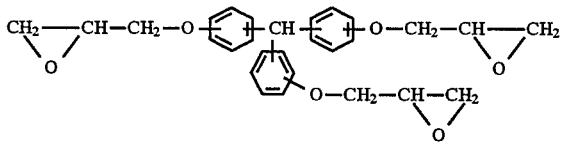

Then, the mixture was dissolved into 133 g of ethyleneglycol monomethylether, thereby obtaining a 60 wt % conc. varnish for laminated plate.

This varnish was impregnated into woven fabric of glass having a thickness of 18 mm, followed by drying the impregnated varnish. As the result, there was obtained a prepreg with a resin content of 48% by weight. Four sheets of this prepreg were laminated, and then copper foils of 35 μm thick each were placed onto both surfaces of the laminated prepreg, followed by press-shaping the combination. The shaping was done under the conditions of 190° C. of a pressing temperature, 40 kg/cm² of a compression, and 60 min. of a pressing time.

Table 2 below shows the results of evaluation of the physical and electrical properties of the copper-lined laminate obtained in the above-described manner.

EXAMPLE 16

To 100 g of a composition (A) obtained by mixing 62 g of the poly-functional epoxy resin ("EPPN-502", a tradename for a product of Nihon Kayaku K. K.) represented by the following chemical formula and 38 g of polyphenol compound ("PSF-4261", a tradename for a product of Gun-Ei Kagaku Co. Ltd.) having an equivalent ratio of the phenolic hydroxyl group to the epoxy group of 1.0, there were mixed 10 g of an imide composition (B) obtained by reacting 4,4'-bismaleimide diphenylether and diaminodiphenylmethane in dioxane solvent, at a molar ratio of 1:0.3, and at a temperature of 60° C. for two hours, 50 g of polystyrene having a molecular weight of 15,000, and 0.1g of 2-ethyl-4-methylimidazol.

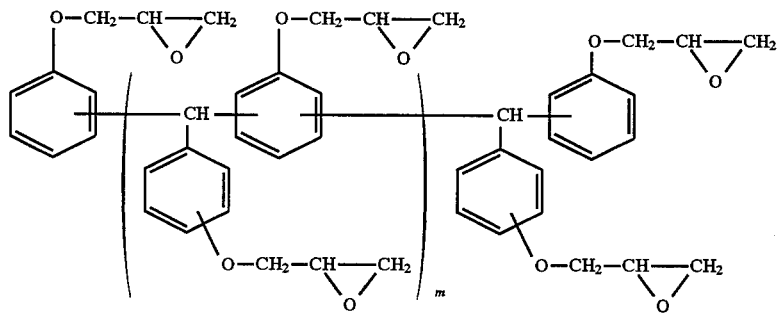

[where: m=1]

Then, the mixture was dissolved into 73 g of ethyleneglycol monomethylether, thereby obtaining a 60 wt % conc. varnish for laminated plate.

This varnish was impregnated into woven fabric of glass having a thickness of 0.18 mm, followed by drying the impregnated varnish. As the result, there was obtained a prepreg with a resin content of 52% by weight. Four sheets of this prepreg we laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 60 min. of a pressing time.

Table 2 below shows the results of evaluation of the physical and electrical properties of the copper-lined laminate obtained in the above-described manner.

COMPARATIVE EXAMPLE 4

To 125 g of epoxy resin ("EPIKOTE 5046B-80", a tradename for a product of Yuka-Shell Co. Ltd.), there were added 2 g of dicyandiamide and 0.15 g of 2-ethyl-4-methylimidazole. Then, the mixture was dissolved into 65 g of ethyleneglycol monomethylether, thereby obtaining a 53 wt % conco resin composition for laminated plate.

This resin composition was impregnated into woven fabric of glass having a thickness of 0.18 mm, followed by drying the impregnated resin. As the result, there was obtained a prepreg with a resin content of 47% by weight.

Four sheets of this prepreg were laminated, and then copper foils of 35 μm thick each were placed onto both surfaces of the laminated prepreg, followed by press-shaping the combination. The shaping was done under the conditions of 170° C. of a pressing temperature, 40 kg/cm² of a compression, and 60 min. of a pressing time.

Table 2 below shows the results of evaluation of the physical and electrical properties of the copper-lined laminate obtained in the above-described manner.

COMPARATIVE EXAMPLE 5

100 g of polyimide resin ("KELIMIDE-601", a tradename for a product of Nippon Polyimide K. K.) was dissolved into 100 g of N-methylpyrrolidone, thereby obtaining a 50 wt % conc. resin composition for laminated plate.

This resin composition was impregnated into woven fabric of glass having a thickness of 0.18 mm, followed by drying the impregnated resin at a temperature of 150° C. for 30 minutes, whereby there was obtained a prepreg with a resin content of 45% by weight.

Four sheets of this prepreg were laminated, and then copper foils of 35 μm thick each were placed onto both surfaces of the laminated prepreg, and the combination was heated under pressure for 90 minutes, at 220° C. under 40 kg/cm². Table 2 below shows the results of evaluation of the physical and electrical properties of the copper-lined laminate obtained in the above-described manner.

As described in the foregoing examples of the present invention and the comparative examples, the resin compositions for laminated plate according to the present invention not only have excellent heat-resistant property comparable with those of the conventional resin compositions for laminated plate, but also have excellent toughness and adhesiveness. Further, the resin compositions for laminated plate according to other examples of the present invention have more excellent toughness and adhesiveness than the above-mentioned examples. Furthermore, the resin compositions for laminated plate according to still other examples of the present invention are excellent in their moisture-resistant property and mechanical strength, in addition to the above-mentioned effect.

TABLE 2

EVALUATIONS OF COPPER-LINED LAMINATED PLATE

| Particulars | Example 5 | Example 6 | Example 7 | Example 8 | Example 9 | Example 10 | Example 11 | Example 12 |
|---|---|---|---|---|---|---|---|---|
| Solder Heat-Resistance (sec, 260° C.) | >300 | >300 | >300 | >300 | >300 | >300 | >300 | >300 |
| Adhesive Strength of Copper Foils (kg/cm, at 200° C.) | 1.6 | 1.7 | 1.5 | 1.9 | 1.4 | 1.9 | 1.3 | 1.3 |
| Dielectric Resistance ($\Omega$) | $2.0 \times 10^{15}$ | $2.5 \times 10^{15}$ | $1.5 \times 10^{15}$ | $2.5 \times 10^{15}$ | $2.5 \times 10^{15}$ | $2.2 \times 10^{15}$ | $1.9 \times 10^{15}$ | $2.8 \times 10^{15}$ |
| Water Absorption (%) | 0.11 | 0.13 | 0.11 | 0.12 | 0.18 | 0.10 | 0.12 | 0.23 |
| Thermal Expansion Coefficient ($10^{-6}$/°C.) | 44 | 49 | 45 | 48 | 43 | 45 | 49 | 43 |
| Bending Strength (kg/mm$^2$) | 63 | 64 | 63 | 66 | 64 | 63 | 53 | 49 |
| Thermal Deformation Temperature (°C.) | 210 | 215 | 215 | 215 | 220 | 202 | 228 | 248 |

| Particulars | Example 13 | Example 14 | Example 15 | Example 16 | Comparative Example 4 | Comparative Example 5 |
|---|---|---|---|---|---|---|
| Solder Heat-Resistance (sec, 260° C.) | >300 | >300 | >300 | >300 | >300 | >300 |
| Adhesive Strength of Copper Foils (kg/cm, at 200° C.) | 1.7 | 1.5 | 1.4 | 1.9 | 0.2 | 0.8 |
| Dielectric Resistance ($\Omega$) | $2.0 \times 10^{15}$ | $1.5 \times 10^{15}$ | $2.5 \times 10^{15}$ | $2.2 \times 10^{15}$ | $5.0 \times 10^{15}$ | $1.5 \times 10^{15}$ |
| Water Absorption (%) | 0.13 | 0.13 | 0.18 | 0.10 | 0.12 | 0.40 |
| Thermal Expansion Coefficient ($10^{-6}$/°C.) | 48 | 45 | 43 | 45 | 80 | 40 |
| Bending Strength (kg/mm$^2$) | 64 | 51 | 64 | 63 | 35 | 46 |
| Thermal Deformation Temperature (°C.) | 210 | 215 | 220 | 202 | 120 | 235 |

Note:
1) Solder heat-resistance, adhesive strength of copper foil, dielectric resistance, and water absorption are in accordance with JIS C-6481.
2) Thermal expansion coefficient, bending strength, and heat-deformation temperature are in accordance with JIS K-6911.

EXAMPLE 17

To 100 g of a composition (Ia) obtained by mixing 39 g of the poly-functional epoxy resin ("EPPN-501", a tradename for a product of Nihon Kayaku K. K.), as represented by the following chemical formula and 61 g of tetrabromobisphenol A (having an equivalent ratio of the phenolic hydroxyl group to the epoxy group of 0.95), there were mixed 46 g of phenoxy resin ("PKHH", a tradename for a product of Union Carbide Corporation) having a weight average molecular weight of 60,000 and 0.1 g of 2-ethyl-4-methylimidazol.

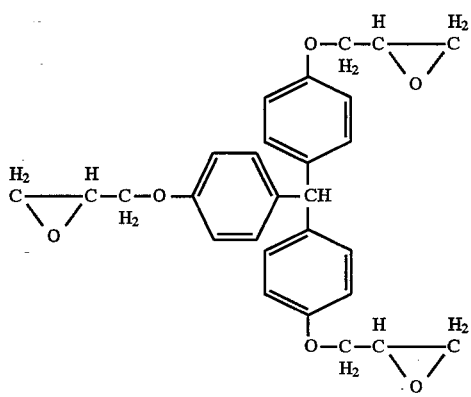

Then, the mixture was dissolved into 125 g of ethyleneglycol monomethylether, thereby obtaining a 60% conc. resin composition for laminated plate, according to one example of the present invention.

This resin composition was impregnated into woven fabric of glass having a thickness of 0.18 mm, followed by drying the impregnated resin composition. As the result, there was obtained a prepreg with a resin content of 48% by weight. Four sheets of this prepreg were laminated, and then copper foils of 35 μm thick each were placed onto both surfaces of the laminated prepreg, followed by press-shaping the combination. The shaping was done under the conditions of 190° C. of a pressing temperature, 40 kg/cm$^2$ of a compression, and 60 min. of a pressing time.

Table 3 below shows the results of evaluation of the physical and electrical properties of the copper-lined laminate obtained in the above-described manner.

EXAMPLE 18

To a composition obtained by mixing 46 g of the poly-functional epoxy resin, as used in Example 17 above, and 54 g of tetrabromobisphenol A (having an equivalent ratio of the phenolic hydroxyl group to the epoxy group of 0.7), there were mixed 95 g of polyester resin ("BYRON-200", a tradename for a product of Toyo Boseki K. K.), and 0.2 g of 2-phenylimidazole. Then, the mixture was dissolved into 100 g of methylethylketone, and 87 g of ethyleneglycol monomethyl ether, thereby obtaining a 55% conc. resin composition for laminated plate, according to another example of the present invention.

This resin composition was impregnated into woven fabric of glass having a thickness of 0.18 mm, followed by drying the impregnated resin composition. As the result, there was obtained a prepreg with a resin content of 52% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm$^2$ of a compression, and 60 min. of a pressing time.

Table 3 below shows the results of evaluation of the physical and electrical properties of the copper-lined laminate obtained in the above-described manner.

EXAMPLE 19

To a composition obtained by mixing 36 g of the poly-functional epoxy resin, as used in Example 17 above, and 64 g of tetrabromobisphenol A (having an equivalent ratio of the phenolic hydroxyl group to the epoxy group of 1.1), there were mixed 8 g of polysulfone resin ("P-170", a tradename for a product of AMOCO), and 0.12 g of 2-ethyl-4-methylimidazole. Then, the mixture was dissolved into 30 g of acetone and 59 g of methylethylketone, thereby obtaining a 63% conc. resin composition for laminated plate, according to another example of the present invention.

This resin composition was impregnated into woven fabric of glass having a thickness of 0.18 mm, followed by drying the impregnated resin composition. As the result, there was obtained a prepreg with a resin content of 55% by weight.

Four sheets of this prepreg were laminated, and then copper foils of 35 μm thick each were placed onto both surfaces of the laminated prepreg, followed by press-shaping the combination. The shaping was done under the conditions of 200° C. of a pressing temperature, 30 kg/cm$^2$ of a compression, and 90 min. of a pressing time.

Table 3 below shows the results of evaluation of the physical and electrical properties of the copper-lined laminate obtained in the above-described manner.

EXAMPLE 20

To a composition obtained by mixing 49 g of the poly-functional epoxy resin, as used in Example 17 above, and 51 g of dibromobisphenol A (having an equivalent ratio of the phenolic hydroxyl group to the epoxy group of 0.9), there were mixed 29 g of phenoxy resin ("YP-50", a tradename for a product of Toto Kasei K. K.), and 0.23 g of 2-ethylimidazoline. Then, the mixture was dissolved into 30 g of N,N-dimethylacetamide and 87 g of ethyleneglycol monomethylether, thereby obtaining a 58% conc. resin composition for laminated plate, according to still another example of the present invention.

This resin composition was impregnated into woven fabric of glass having a thickness of 0.18 mm, followed by drying the impregnated resin composition. As the result, there was obtained a prepreg with a resin content of 51% by weight.

Four sheets of this prepreg were laminated, and then copper foils of 35 μm thick each were placed onto both surfaces of the laminated prepreg, followed by press-shaping the combination. The press-shaping was done under the same conditions as in Example 18 above.

Table 3 below shows the results of evaluation of various properties of the copper-lined laminate obtained in the above-described manner.

EXAMPLE 21

A resin Composition for laminated plate according to other example of the present invention was produced in the same manner as in example 17 with the exception that 39 g of the poly-functional epoxy resin ("EPPN-501") was replaced by 80 g of a poly-functional epoxy resin ("DER-T-542", a tradename for a product of Dow Chemical Co. Ltd.), represented by the following chemical formula:

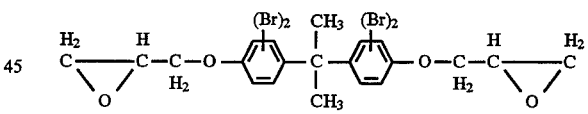

[where: a is an integer of from 1 to 4]; and 61 g of the tetrabromobisphenol A was replaced by 20 g of a phenolic resin represented by the following chemical formula:

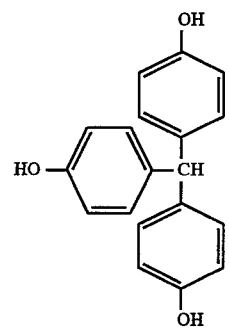

With this resin composition, the copper-lined laminated plate was obtained in the same manner as mentioned Example 17 above, the physical and electrical properties of which are shown in Table 3 below.

EXAMPLE 22

A resin composition for laminated plate according to still other example of the present invention was produced in the same manner as in example 18, with the exception that the poly-functional epoxy resin was replaced by 84 g of the poly-functional epoxy resin used in Example 21 above, and the tetrabromobisphenol A was replaced by 16 g of the phenolic resin used in Example 21 above. With this resin composition, the copper-lined laminated plate was obtained in the same manner as mentioned above, the physical and electrical properties of which are shown in Table 3 below.

EXAMPLE 23

A resin composition for laminated plate according to further example of the present invention was produced in the same manner as in example 19, with the exception that teh poly-functional epoxy resin was replaced by 78 g of the poly-functional epoxy resin used in Example 21 above, and the tetrabromobisphenol A was replaced by 22 g of the phenolic resin used in Example 21 above. With this resin composition, the copper-lined laminated plate was obtained in the same manner as mentioned above, the physical and electrical properties of which are shown in Table 3 below.

EXAMPLE 24

A resin composition for laminated plate according to still further example of the present invention was produced in the same manner as in example 20, with the exception that the poly-functional epoxy resin was replaced by 81 g of the poly-functional epoxy resin used in Example 21 above, and the dibromobisphenol A was replaced by 19 g of the phenolic resin used in Example 21. With this resin composition, the copper-lined laminated plate was obtained in the same manner as mentioned above, the physical and electrical properties of which are shown in Table 3 below.

COMPARATIVE EXAMPLE 6

In place of the phenoxy resin having a molecular weight of 50,000 as in Example 17, use was made of epoxy resin ("EPIKOTE 1001", a tradename for a product of Yuka-Shell Co. Ltd.). The copper-lined laminated plate was obtained in the same manner as in Example 17 above.

COMPARATIVE EXAMPLE 7

A copper-lined laminated plate was obtained in the same manner as in Example 17 above, with the exception that phenoxy resin, as the straight chain high molecular weight compound, in Example 17 was not mixed.

COMPARATIVE EXAMPLE 8

Instead of using 95 g of polyester resin in Example 18 above, 120 g of the same resin was used. The copper-lined laminated plate was obtained in the same manner as above.

Table 3 below indicates the results of evaluation of the copper-lined laminated plates as obtained in the above Comparative Examples 6, 7 and 8.

As is apparent from Table 3, the resin compositions for laminated plate as produced by the foregoing Examples of the present invention, in the cured form, are excellent in their heat-resistant property, mechanical strength and toughness in comparison with those of Comparative Examples, with the consequence that, when such resin composition is used for obtaining the copper-laminated plate, it exhibits excellent adhesive property.

TABLE 3

EVALUATIONS OF COPPER-LINED LAMINATED PLATE

| Particulars | Example 17 | Example 18 | Example 19 | Example 20 | Example 21 | Example 22 |
|---|---|---|---|---|---|---|
| Solder Heat-Resistance (sec, 260° C.) | >300 | >300 | >300 | >300 | >300 | >300 |
| Adhesive Strength of Copper Foils (kg/cm, at 200° C.) | 1.9 | 1.8 | 1.4 | 1.6 | 1.4 | 1.5 |
| Dielectric Resistance ($\Omega$) | $1.8 \times 10^{15}$ | $3.2 \times 10^{15}$ | $1.5 \times 10^{15}$ | $2.5 \times 10^{15}$ | $2.7 \times 10^{15}$ | $6.2 \times 10^{15}$ |
| Water Absorption (%) | 0.09 | 0.16 | 0.10 | 0.22 | 0.30 | 0.13 |
| Thermal Expansion Coefficient ($10^{-6}$/°C.) | 45 | 63 | 35 | 29 | 48 | 43 |
| Bending Strength (kg/mm$^2$) | 58 | 49 | 67 | 51 | 61 | 52 |
| Thermal Deformation Temperature (°C.) | 195 | 183 | 209 | 192 | 203 | 193 |

| Particulars | Example 23 | Example 24 | Comparative Example 6 | Comparative Example 7 | Comparative Example 8 |
|---|---|---|---|---|---|
| Solder Heat-Resistance (see, 260° C.) | >300 | >300 | >300 | >300 | 250 |
| Adhesive Strength of Copper Foils (kg/cm, at 200° C.) | 1.2 | 1.6 | 0.9 | 0.5 | 1.8 |
| Dielectric Resistance ($\Omega$) | $2.8 \times 10^{15}$ | $4.9 \times 10^{15}$ | $7.3 \times 10^{15}$ | $5.1 \times 10^{15}$ | $3.2 \times 10^{15}$ |
| Water Absorption (%) | 0.11 | 0.15 | 0.32 | 0.36 | 0.42 |
| Thermal Expansion Coefficient ($10^{-6}$/°C.) | 34 | 31 | 40 | 32 | 98 |

TABLE 3-continued

| EVALUATIONS OF COPPER-LINED LAMINATED PLATE | | | | | |
|---|---|---|---|---|---|
| Bending Strength (kg/mm$^2$) | 58 | 45 | 50 | 65 | 28 |
| Thermal Deformation Temperature (°C.) | 212 | 206 | 185 | 210 | 168 |

Note:
1) Solder heat-resistance, adhesive strength of copper foil, dielectric resistance, and water absorption are in accordance with JIS C-6481.
2) Thermal expansion coefficient, bending strength, and heat-deformation temperature are in accordance with JIS K-6911.

EXAMPLE 25

65 g Of the poly-functional epoxy resin ("EPPN-501", a tradename for a product of Nihon Kayaku K. K.), as represented by the following chemical formula and 35 g of tetrabromobisphenol A (an equivalent ratio of the epoxy group of the poly-functional epoxy resin to the hydroxy group of brominated bisphenol A being 3.0) were mixed, and oligoepoxy resin (α) (a=2) was obtained in methylisobutylketone as a solvent, in the presence of triphenylphosphine as a catalyst.

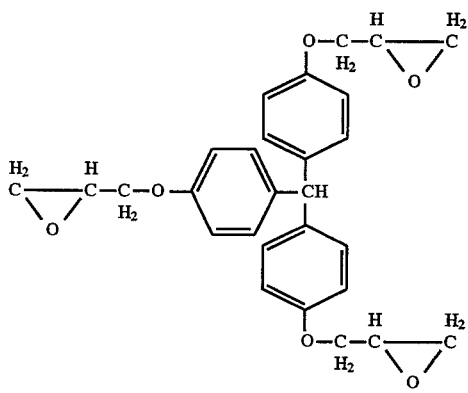

To a composition (I) obtained by mixing 77 g of this oligoepoxy resin and 23 g of phenolic resin (having a weight average molecular weight of 3,500) which was produced by poly-condensation of bisphenol A and formaldehyde (having an equivalent ratio of the phenolic hydroxyl group of the phenolic resin to the epoxy group of the oligoepoxy resin of 0.95), there were admixed. 46 g of phenoxy resin ("PKHH", a tradename for a product of Union Carbide Corp.) having a molecular weight of 50,000, and 0.1 g of 2-ethyl-4-methylimidazole. Then, the mixture was dissolved into 125 g of ethyleneglycol monomethylether, thereby obtaining a 60% conc. resin composition for laminated plate, according to one example of the present invention.

This resin composition was impregnated into woven fabric of glass having a thickness of 0.18 mm, followed by drying the impregnated resin composition. As the result, there was obtained a prepreg with a resin content of 48% by weight. Four sheets of this prepreg were laminated, and then copper foils of 35 µm thick each ere placed onto both surfaces of the laminated prepreg, followed by press-shaping the combination. The shaping as done under the conditions of 190° C. of a pressing temperature, 40 kg/cm$^2$ of a compression, and 60 min. of a pressing time.

Table 4 below shows the results of evaluation of the physical and electrical properties of the copper-lined laminate obtained in the above described manner.

EXAMPLE 26

69 g of the poly-functional epoxy resin used in Example 25 above and 31 g of tetrabromobisphenol A (having an equivalent ratio of the epoxy group in the poly-functional epoxy resin to the hydroxyl group in brominated bisphenol A of 3.5%) were mixed, and the oligoepoxy resin (α) was obtained in the same manner as in Example 25 above.

To a composition obtained by mixing 82 g of this oligoepoxy resin and 18 g of the phenolic resin having a weight average molecular weight of 1,500, which was obtained by poly-condensation of bisphenol A and formaldehyde (an equivalent ratio of the phenolic hydroxyl group of the phenolic resin to the epoxy group of the oligoepoxy resin being 0.7), there were admixed 95 g of polyester resin ("BYRON-200", a tradename for a product of Toyo Boseki K. K.) having a molecular weight of 15,000 and 0.2 g of 2-phenylimidazole.

Then, the mixture was dissolved into 100 g of methylethylketone and 87 g of ethyleneglycol monomethylether, thereby obtaining a 55% conc. resin composition for laminated plate, according to another example of the present invention.

This resin composition was impregnated into woven fabric of glass having a thickness of 0.18 mm, followed by drying the impregnated resin composition. As the result, there was obtained a prepreg with a resin content of 52% by weight.

Four sheets of this prepreg were laminated, and then copper foils of 35 µm thick each were placed onto both surfaces of the laminated prepreg, followed by press-shaping the combination. The shaping was done under the conditions of 180° C. of a pressing temperature, 40 kg/cm$^2$ of a compression, and 60 min. of a pressing time.

Table 4 below shows the results of evaluation of the physical and electrical properties of the copper-lined laminate obtained in the above-described manner.

EXAMPLE 27

81 g of the poly-functional epoxy resin used in Example 25 above and 19 g of dibromobisphenol A (having an equivalent ratio of the epoxy group in the poly-functional epoxy resin to the hydroxyl group in bromobisphenol A of 5.0) were mixed, and the oligoepoxy resin (α) was obtained in the same manner as in Example 25 above.

To a composition obtained by mixing 72.5 g of this oligoepoxy resin and 27.5 g of the phenolic resin having a weight average molecular weight of 3,500, which was obtained by poly-condensation of bisphenol A and formaldehyde (an equivalent ratio of the phenolic hydroxyl group to the epoxy group being 1.1), there were admixed 8 g of polysulfone resin ("P-170", a tradename for a product of AMOCO) and 0.12 g of 2-ethyl-4-methylimidazole. Then, the mixture was dissolved into 30 g of acetone and 59 g of methylethylketone, thereby obtaining a 63% conc. resin composition for laminated plate, according to another example of the present invention.

This resin composition was impregnated into woven fabric of glass having a thickness of 0.18 mm, followed by drying the impregnated resin composition. As the result, there was obtained a prepreg with a resin content of 55% by weight. Four sheets of this prepreg were laminated, and then copper foils of 35 μm thick each were placed onto both surfaces of the laminated prepreg, followed by press-shaping the combination. The shaping was done under the conditions of 200° C. of a pressing temperature, 30 kg/cm$^2$ of a compression, and 90 min. of a pressing time.

Table 4 below shows the results of evaluation of the physical and electrical properties of the copper-lined laminate obtained in the above-described manner.

EXAMPLE 28

69 g of the poly-functional epoxy resin used in Example 25 above and 31 g of tetrabromobisphenol A (having an equivalent ratio of the epoxy group in the poly-functional epoxy resin to the hydroxyl group in bromobisphenol A of 3.5) were mixed, and the oligoepoxy resin (α) was obtained in the same manner as in Example 25 above.

To a composition obtained by mixing 78 g of this oligoepoxy resin and 22 g of the phenolic resin having a weight average molecular weight of 6,000, which was obtained by poly-condensation of bisphenol A and formaldehyde (an equivalent ratio of the phenolic hydroxyl group to the epoxy group being 0.9), there were admixed 29 g of phenoxy resin ("YP-50", a tradename for a product of Toro Kasei K. K.) having a weight average molecular weight of 30,000 and 0.23 g of 2-ethylimidazoline. Then, the mixture was dissolved into 30 g of N,N-dimethylacetamide and 87 g of ethyleneglycol monomethylether, thereby obtaining a 58% conc. resin composition for laminated plate, according to still another example of the present invention.

This resin composition was impregnated into woven fabric of glass having a thickness of 0.18 mm, followed by drying the impregnated resin composition. As the result, there was obtained a prepreg with a resin content of 51% by weight. Four sheets of this prepreg were laminated, and then copper foils of 35 μm thick each were placed onto both surfaces of the laminated prepreg, followed by press-shaping the combination. The shaping was done under the same conditions as in Example 26 above. Table 4 below shows the results of evaluation of the physical and electrical properties of the copper-lined laminate obtained in the above-described manner.

COMPARATIVE EXAMPLE 9

In Example 25 above, epoxy resin having a molecular weight of 1,000 ("EPIKOTE-1001", a tradename for a product of Yuka-Shell Co. Ltd.) was used in place of phenoxy resin having a molecular weight of 50,000, and the copper-lined laminated plate was produced in the same manner as in Example 25.

COMPARATIVE EXAMPLE 10

In the same manner as in Example 25, the copper-lined laminated plate was produced, except for omitting phenoxy resin which is a straight chain high molecular weight compound.

COMPARATIVE EXAMPLE 11

In accordance with Example 26, the copper-lined laminated plate was obtained with use of 120 g of polyester resin, instead of 95 g thereof.

Table 4 below indicates the results of evaluation of various properties of the copper-lined laminated plates as obtained by the above-mentioned Comparative Examples 9, 10 and 11.

As is apparent from Table 4, the resin compositions for laminated plate according to these examples of the present invention in their cured form, are excellent not only in heat-resistant property which is comparable with the resin compositions of the comparative examples, but also further in mechanical strength and toughness, and, when these resin compositions are used for manufacturing the copper-lined laminated plate, they exhibit excellent adhesive property.

TABLE 4

EVALUATIONS OF COPPER-LINED LAMINATED PLATE

| Particulars | Example 25 | Example 26 | Example 27 | Example 28 | Comparative Example 10 | Comparative Example 11 |
|---|---|---|---|---|---|---|
| Solder Heat-Resistance (sec, 260° C.) | >300 | >300 | >300 | >300 | >280 | >260 |
| Adhesive Strength of Copper Foils (kg/cm, at 200° C.) | 1.8 | 2.0 | 1.5 | 1.6 | 1.2 | 1.0 |
| Dielectric Resistance (Ω) | $2.5 \times 10^{15}$ | $1.9 \times 10^{15}$ | $2.8 \times 10^{15}$ | $2.0 \times 10^{15}$ | $2.7 \times 10^{15}$ | $1.3 \times 10^{15}$ |
| Water Absorption (%) | 0.12 | 0.15 | 0.16 | 0.12 | 0.11 | 0.31 |
| Thermal Expansion Coefficient ($10^{-6}$/°C.) | 46 | 51 | 41 | 48 | 40 | 80 |
| Bending Strength (kg/mm$^2$) | 64 | 62 | 64 | 61 | 49 | 42 |
| Thermal Deformation Temperature (°C.) | 212 | 201 | 215 | 208 | 213 | 168 |

Note:
1) Solder heat-resistance, adhesive strength of copper foil, dielectric resistance, and water absorption are in accordance with JIS C-6481.
2) Thermal expansion coefficient, bending strength, and heat-deformation temperature are in accordance with JIS K-6911.

EXAMPLE 29

To 100 g of a composition (I) obtained by mixing 65 g of the poly-functional epoxy resin ("TACTIX-742", a tradename for a product of Dow Chemical Co. Ltd.) represented by the following chemical formula and 35 g of phenolic resin ("PSF-4261", a tradename for a product of Gun-Ei Kagaku K. K.) having an equivalent ratio of the phenolic hydroxyl group to the epoxy group of 0.7, there were admixed 20 g of trihydroxyethyl isocyanuric acid triacrylate (II) ("FA-731A", a tradename for a product of Hitachi Kasei K. K.), 15 g of polyparabanic acid ("XT-4" a tradename for a product of Tohnen Sekiyu K. K.), and 0.1 g of 2-ethyl-4-methylimidazole.

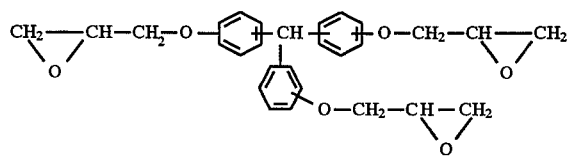

Then, the mixture was dissolved into 50 g of ethyleneglycol monomethylether and 30 g of cyclohexanone, thereby obtaining a 60% conc. resin composition for laminated plate, according to other example of the present invention.

This resin composition was impregnated into woven fabric of glass having a thickness of 0.18 mm, followed by drying the impregnated resin composition. As the result, there was obtained a prepreg with a resin content of 50% by weight. Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 90 min. of a pressing time.

Table 5a below shows the results of evaluation of the physical and electrical properties of the copper-lined laminate obtained in the above-described manner.

EXAMPLE 30

To 100 g of a composition (I) obtained by mixing 57 g of poly-functional epoxy resin ("EPPN-502", a tradename for a product of Nihon Kayaku K. K.) represented by the following Chemical formula and 43 g of phenolic resin ("PZ-6000", a tradename for a product of Hitachi Kasei K. K.) having an equivalent ratio of the phenolic hydroxyl group to the epoxy group of 0.95, there were admixed 10 g of an trihydroxyethyl isocyanuric acid triacrylate (II) ("FA-731A", a tradename for a product of Hitachi Kasei K. K.), 10 g of phenoxy resin having a molecular weight of 30,000 ("PKHH", a tradename for a product of Union Carbide Corp.), and 0.1 g of 2-ethyl-4-methylimidazole.

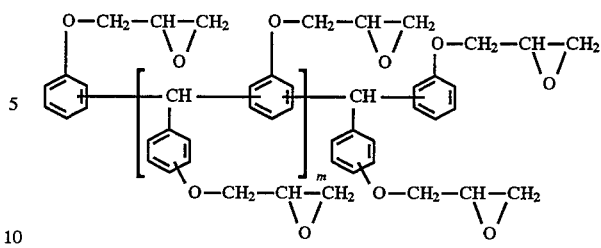

Then, the mixture was dissolved into 80 g of ethyleneglycol monomethylether, thereby obtaining a 60% conc. resin composition for laminated plate, according to further example of the present invention.

This resin composition was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 90 min. of a pressing time.

Table 5a below shows the results of evaluation of the physical and electrical properties of the copper-lined laminate obtained in the above-described manner.

EXAMPLE 31

To 100 g of a composition (I) obtained by mixing 71 g of the poly-functional epoxy resin represented by the following chemical formula and 29 g of phenolic resin ("YLH-129", a tradename for a product of Yuka-Shell Co. Ltd.), there were admixed 10 g of trihydroxyethyl isocyanuric acid triacrylate (II) ("FA-731A", a tradename for a product of Hitachi Kasei K. K.), 15 g of polyethersulfone ("VICTOREX", a tradename for a product of I.C.I. Japan), and 0.1 g of 2-ethyl-4-methylimidazole.

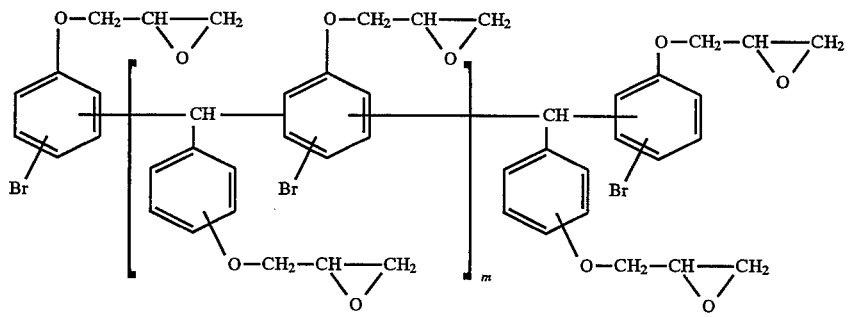

[m=3]

Then, the mixture was dissolved into 50 g of ethyleneglycol monomethylether and 30 g of N,N-dimethylformamide, thereby obtaining a 58% conc. varnish for laminated plate, according to still further example of the present invention.

The poly-functional epoxy resin represented by the above chemical formula was obtained in the following procedures: first of all, 384 parts of parabromophenol and 61 parts of salicylaldehyde were reacted for 30 minutes at a temperature of 100° C. in the presence of 0.3 part of concentrated hydrochloric acid, and then 0.5 part of p-toluenesulfonic acid was added to the reaction product to continue reaction for another two hours at 180° C., thereby obtaining polyphenol represented by the following chemical formula

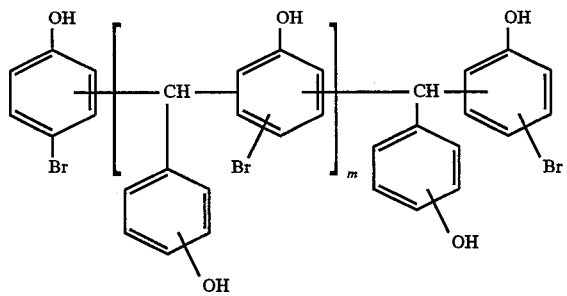

[where: m=3];
thereafter, 110 parts of this polyphenol and 740 parts of epichlorohydrin were reacted in accordance with ordinary method to obtain the poly-functional epoxy resin.

This resin composition was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 90 min. of a pressing time.

Table 5a below shows the results of evaluation of the physical and electrical properties of the copper-lined laminate obtained in the above-described manner.

EXAMPLE 32

There were mixed 65 g of the poly-functional epoxy resin used in Example 25 above, 30 g of phenolic resin ("YLH-t29", a tradename for a product of Yuka-Shell Co. Ltd.), 5 g of silicone-modified polyphenolic resin, 20 g of phenoxy resin having a molecular weight of 30,000 ("PKHH", a tradename for a product of Union Carbide Corp.), and 0.1 g of 2-ethyl-4-methylimidazole. Then, the mixture was dissolved into 80 g of ethyleneglycol monomethylether, thereby obtaining a 60% conc. resin composition for laminated plate, according to additional example of the present invention.

The silicone-modified phenolic resin to used in this example was obtained by the following procedures: 100 parts of silicone compound ("X-22-3667", a tradename for a product of Shin-Etsu Silicon K. K.) containing an epoxy group at both ends of its molecule having an epoxy equivalent of 3,800, 84.8 parts of phenolic resin ("PSF-4261", a tradename for a product of Gun-Ei Kagaku K. K.) having an equivalent ratio of the phenolic hydroxyl group to the epoxy group of 20, and 0.08 part of triphenylphosphine were reacted for 24 hours at a temperature of 160° C., while blowing nitrogen into the reactants, to thereby subject the phenolic resin and the silicone compound having an epoxy group at both ends of the molecule to preliminary reaction.

The above-mentioned resin composition for laminated plate was impregnated into woven fabric of glass having a thickness of 0.18 mm, followed by drying the impregnated resin composition. As the result, there was obtained a prepreg with a resin content of 55% by weight.

Four sheets of this prepreg were laminated, and then copper foils of 35 μm thick each were placed onto both surfaces of the laminated prepreg, followed by press-shaping the combination. The shaping was done under the conditions of 170° C. of a pressing temperature, 40 kg/cm² of a compression, and 60 min. of a pressing time.

Table 5b below shows the results of evaluation of physical and electrical properties of the thus obtained copper-lined laminate.

EXAMPLE 33

There were mixed 65 g of the poly-functional epoxy resin used in Example 29, 20 g of phenolic resin ("YLH-129", a tradename for a product of Yuka-Shell Co Ltd.), 15 g of silicone-modified phenlic resin used in Example 32, 15 g of polyethersulfone and 0.1 g of 2-ethyl-4-methylimidazole. Then, the mixture was dissolved into 100 g of ethyleneglycol monomethylether, thereby obtaining a 60% conc. resin composition for laminated plate, according to still additional example of the present invention.

This resin composition was impregnated into woven fabric of glass having a thickness of 0.18 mm, followed by drying the impregnated resin composition. As the result, there was obtained a prepreg with a resin content of 53% by weight.

Four sheets of this prepreg were laminated, and then copper foils of 35 μm thick each were placed onto both surfaces of the laminated prepreg, followed by press-shaping the combination. The shaping was done under the conditions of 170° C. of a pressing temperature, 40 kg/cm² of a compression, and 60 min. of a pressing time.

Table 5b below shows the results of evaluation of the physical and electrical properties of the copper-lined laminate obtained in the above-described manner.

EXAMPLE 34

There were mixed 65 g of the poly-functional epoxy resin used in Example 30, 20 g of phenolic resin ("YLH-129", a tradename for a product of Yuka-Shell Co. Ltd.), 15 g of silicone-modified phenolic resin used in Example 32, 10 g of phenoxy resin having a molecular weight of 30,000, and 0.1 g of 2-ethyl-4-methylimidazole. Then, the mixture was dissolved into 74 g of ethyleneglycol monomethylether, thereby obtaining a 60% conc. resin composition for laminated plate, according to still additional example of the present invention.

This resin composition was impregnated into woven fabric of glass having a thickness of 0.18 mm, followed by drying the impregnated resin composition. As the result, there was obtained a prepreg with a resin content of 52% by weight.

Four sheets of this prepreg were laminated, and then copper foils of 35 μm thick each were placed onto both surfaces of the laminated prepreg, followed by press-shaping the combination. The shaping was done under the conditions of 170° C. of a pressing temperature, 40 kg/cm² of a compression, and 60 min. of a pressing time.

Table 5b below shows the results of evaluation of the physical and electrical properties of the copper-lined laminate obtained in the above-described manner.

EXAMPLE 35

There were mixed 66 g of the poly-functional epoxy resin represented by the following chemical formula, 28 g of phenolic resin ("PZ-6000", a tradename for product of Hitachi Kasei K. K.), 6 g of silicone-modified phenolic resin, 15 g of polyparabanic acid, and 0.1 g of 2-ethyl-4-methylimidazole.

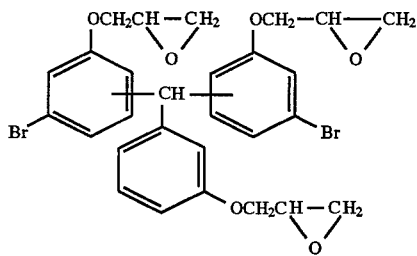

Then, the mixture was dissolved into 30 g of cyclohexanone and 50 g of ethylenglycol monoethylether, thereby obtaining a resin composition for laminated plate, according to still additional example of the present invention.

The poly-functional epoxy resin to be used this example produced by the following procedures: 128 parts of m-bromophenol and 122 parts of salicylaldehyde were agitated in 600 cc of glacial acetic acid at 4° C., while dropping a mixed liquid of sulfuric acid and glacial acetic acid (at a mixing ratio of 100 cc/300 cc), after which the mixed liquid was left for three days at a temperature of 4° C., thereby obtaining polyphenol represented by the following chemical formula, and then 110 parts of this polyphenol was reacted with 740 parts of epichlorohydrin in accordance with ordinary method to result in the poly-functional epoxy resin.

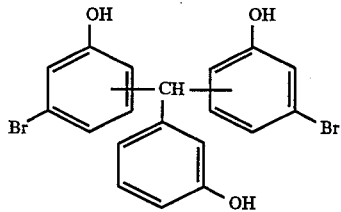

On the other hand, the silicone-modified phenolic resin to be used in this example was produced by reacting, in the same manner as in Example 32 above, 100 parts of a silicone compound containing an epoxy group at both ends of its molecule having an epoxy equivalent of 700 ("XC-96-709", a tradename for a product of Toshiba Silicon K. K.), 212 parts of phenolic resin ("PSF-4261", a tradename of a product of Gun-Ei Kagaku K. K.) having an equivalent ratio of the phenolic hydroxyl group to the epoxy group of 10, and 0.03 part of triphenylphosphine.

The thus obtained resin composition was impregnated into woven fabric of glass having a thickness of 0.18 mm, followed by drying the impregnated resin. As the result, there was obtained a prepreg with a resin content of 48% by weight. Four sheets of this prepreg were laminated, and then copper foils of 35 μm thick each were placed onto both surfaces of the laminated prepreg, followed by press-shaping the combination. The shaping was done under the conditions of 170° C. of a pressing temperature, 40 kg/cm$^2$ of a compression, and 60 min. of a pressing time.

Table 5b below shows the results of evaluation of the physical and electrical properties of the copper-lined laminate obtained in the above-described manner.

EXAMPLE 36

There were mixed 70 g of the poly-functional epoxy resin as used in Example 31 above, 23 g of phenolic resin ("PZ-6000", a tradename for a product of Hitachi Kasei K. K.), 7 g of silicone-modified phenolic resin, 10 g of polysulfone ("YUDEL", a tradename for a produce of AMOCO Chemicals Japan), and 0.1 g of 2-phenylimidazole. Then, the mixture was dissolved into 110 g of ethylenglycol monoethylether, thereby obtaining a resin composition for laminated plate, according to still additional example of the present invention The silicone-modified phenolic resin to be used in this example was produced by reacting, in the same manner as in Example 31 above, 100 parts of a silicone compound containing an epoxy group in the middle of its molecule having an epoxy equivalent of 8,500, 25 parts of phenolic resin ("YLH-129, a tradename for a product of Yuka-Shell Co. Ltd.), and 0.05 part of 2-ethyl-4-methylimidazole.

The thus obtained resin composition for laminated plate was impregnated into woven fabric of glass having a thickness of 0.18 mm, followed by drying the impregnated resin. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination under heat. The shaping was done under the conditions of 200° C. of a pressing temperature, 40 kg/cm$^2$ of a compression, end 60 min. of a pressing time.

Table 5b below shows the results of evaluation of the physical and electrical properties of the copper-lined laminate obtained in the above-described manner.

EXAMPLE 37

There were mixed 100 g of the poly-functional epoxy resin used in Example 35 above, 30 g of phenolic resin ("YLH-129", a tradename for a product of Yuka-Shell Co. Ltd.), 15 g of silicone-modified phenolic resin, 15 g of polyetherimide ("ULTEM", a tradename for a product of Engineering Plastics Co. Ltd.), and 0.1 g of 2-ethyl-4-methylimidazole. Then, the mixture was dissolved into 100 g of N,N'-dimethylformamide and 60 g of ethyleneglycol monoethylether, thereby obtaining a 50 wt % conc. resin composition for laminated plate, according to still further example of the present invention.

The silicone-modified phenolic resin to be used in this example was obtained by reacting, in the same manner as in Example 32 above, 100 parts of silicone compound containing an epoxy group in the middle of its molecule having an epoxy equivalent of 500, 212 parts of phenolic resin ("PSF-4261", a tradename for a product of Gun-Ei Kagaku K. K.) having an equivalent ratio of the phenolic hydroxyl group to the epoxy group of 10, and 0.06 part of triphenylphosphine.

The thus obtained resin composition for laminated plate was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination under heat. The shaping was done under the conditions of 200° C. of a pressing temperature, 40 kg/cm$^2$ of a compression, and 60 min. of a pressing time.

Table 5b below shows the results of evaluation of physical and electrical properties of the thus obtained copper-lined laminate.

COMPARATIVE EXAMPLE 12

To 125 g of epoxy resin ("EPIKOTE 5046B-80", a tradename for a product of Yuka-Shell Co. Ltd.), there were added 2 g of dicyandiamide and 0.15 g of 2-ethyl-4-methylimidazole. Then, the mixture was dissolved into 65 g of ethyleneglycol monomethylether, thereby obtaining a 53 wt % conc. resin composition for laminated plate.

This resin composition was impregnated into woven fabric of glass having a thickness of 0.18 mm, followed by drying the impregnated resin. As the result, there was obtained a prepreg with a resin content of 47% by weight.

Four sheets of this prepreg were laminated, and then copper foils of 35 μm thick each were placed onto both surfaces of the laminated prepreg, followed by press-shaping the combination. The shaping was done under the conditions of 170° C. of a pressing temperature, 40 kg/cm$^2$ of a compression, and 60 min. of a pressing time.

Tables 5a and 5b below indicate the results of evaluation of the physical and electrical properties of the copper-lined laminate obtained in the above-described manner.

COMPARATIVE EXAMPLE 13

100 g of polyimide resino ("KELIMIDE-601", a tradename for a product of Nippon Polyimide K. K.) was dissolved into 100 g of N-methylpyrrolidone, thereby obtaining a 50 wt % conc. resin composition for laminated plate.

This resin composition was impregnated into woven fabric of glass having a thickness of 0.18 mm, followed by drying the impregnated resin at a temperature of 150° C. for 30 minutes, thereby obtaining a prepreg with a resin content of 45% by weight.

Four sheets of this prepreg were laminated, and then copper foils of 35 μm thick each were placed onto both surfaces of the laminated prepreg, and the combination was pressed under heat for 90 minutes, at a temperature of 220° C. and under a pressure of 40 kg/cm$^2$. Tables 5a and 5b below indicate the results of evaluation of the physical and electrical properties of the copper-lined laminate obtained in the above-described manner.

As described in the foregoing examples of the present invention and the comparative examples, the resin compositions for laminated plate according to the present invention are not only excellent in their heat-resistant property, but also further excellent in their moisture-resistant property which is comparable with those of the conventional resin compositions for laminated plate, mechanical strength, toughness and adhesiveness. Further, the resin compositions for laminated plate according to other examples of the present invention, in addition to the above-mentioned properties, have more excellent reliability in their electrical insulation over a long period of time.

TABLE 5a

EVALUATIONS OF COPPER-LINED LAMINATED PLATE

| Particulars | Example 29 | Example 30 | Example 31 | Comparative Example 12 | Comparative Example 13 |
|---|---|---|---|---|---|
| Solder Heat-Resistance (sec, 260° C.) | >300 | >300 | >300 | >300 | >300 |
| Adhesive Strength of Copper Foils (kg/cm, at 200° C.) | 1.6 | 1.7 | 1.5 | 0.2 | 0.8 |
| Dielectric Resistance (Ω) | $2.0 \times 10^{15}$ | $2.5 \times 10^{15}$ | $1.5 \times 10^{15}$ | $5.0 \times 10^{14}$ | $1.5 \times 10^{15}$ |
| Water Absorption (%) | 0.11 | 0.13 | 0.11 | 0.20 | 0.40 |
| Thermal Expansion Coefficient ($10^{-6}$/°C.) | 44 | 49 | 45 | 80 | 40 |
| Bending Strength (kg/mm$^2$) | 63 | 64 | 63 | 35 | 46 |
| Thermal Deformation Temperature (°C.) | 210 | 215 | 215 | 120 | 235 |

Note:
1) Solder heat-resistance, adhesive strength of copper foil, dielectric resistance, and water absorption are in accordance with JIS C-6481.
2) Thermal expansion coefficient, bending strength, and heat-deformation temperature are in accordance with JIS K-6911.

TABLE 5b

EVALUATIONS OF COPPER-LINED LAMINATED PLATE

| Particulars | Example 32 | Example 33 | Example 34 | Example 35 | Example 36 | Example 37 | Comparative Example 12 | Comparative Example 13 |
|---|---|---|---|---|---|---|---|---|
| Solder Heat-Resistance (sec, 260° C.) | >300 | >300 | >300 | >300 | >300 | >300 | >300 | >300 |
| Adhesive Strength of Copper Foils (kg/cm, at 200° C.) | 1.7 | 1.6 | 1.8 | 1.6 | 1.4 | 1.5 | 0.2 | 0.8 |

TABLE 5b-continued

EVALUATIONS OF COPPER-LINED LAMINATED PLATE

| Particulars | Example 32 | Example 33 | Example 34 | Example 35 | Example 36 | Example 37 | Comparative Example 12 | Comparative Example 13 |
|---|---|---|---|---|---|---|---|---|
| Dielectric Resistance ($\Omega$) | $2.0 \times 10^{15}$ | $1.8 \times 10^{15}$ | $2.3 \times 10^{15}$ | $1.6 \times 10^{15}$ | $2.7 \times 10^{15}$ | $1.8 \times 10^{15}$ | $5.0 \times 10^{14}$ | $1.5 \times 10^{15}$ |
| Water Absorption (%) | 0.13 | 0.11 | 0.15 | 0.13 | 0.12 | 0.13 | 0.20 | 0.40 |
| Thermal Expansion Coefficient ($10^{-6}/°C$) | 48 | 46 | 52 | 47 | 54 | 47 | 80 | 40 |
| Bending Strength (kg/mm$^2$) | 63 | 60 | 68 | 62 | 65 | 61 | 35 | 46 |
| Thermal Deformation Temperature (°C.) | 215 | 208 | 205 | 218 | 210 | 203 | 120 | 235 |
| Long term electrical life (h) | >1000 | >1000 | >1000 | >1000 | >1000 | >1000 | <50 | <300 |

Note:
1) Solder heat-resistance, adhesive strength of copper foil, dielectric resistance, and water absorption are in accordance with JIS C-6481.
2) Thermal expansion coefficient, bending strength, and heat-deformation temperature are in accordance with JIS K-6911.
3) Long term electrical life was measured as follows: a test pattern was prepared in accordance with an explanatory diagram 13(A)-C of JIS C6491-1980; using this test pattern, voltage application test was conducted under conditions of 121° C./95% RH/250VDC to determine a time until electrical resistance between the conductors lowered to 106$\Omega$ or below.

EXAMPLE 38

To 100 g of poly-functional epoxy resin ("TACTIX-742", a tradename for a product of Dow Chemical Co. Ltd.), as represented by the following chemical formula, there were admixed 10 g of bisphenol A type epoxy resin ("EPIKOTE-1001", a tradename for a product of Yuka-Shell Co. Ltd.), 25 g of tetrabromobisphenol A, and 0.01 g of triethylamine.

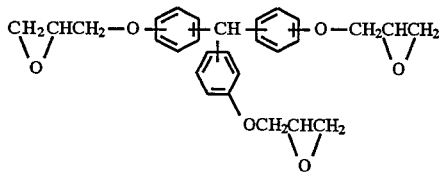

Then, the mixture was heated for one hour at a temperature of 130° C., from which poly-functional epoxy resin (A) with a ratio of reaction of 85% between the epoxy group and the hydroxyl group in the composition was obtained.

To 100 g of a composition (I) obtained by mixing this poly-functional epoxy resin (A) and 25 g of bisphenol A novolac type phenolic resin ("KP-756P", a tradename for a product of Arakawa Kagaku Kogyo), there were admixed 15 g of phenoxy resin (II) having a weight average molecular weight of 30,000 ("PKHH", a tradename for a product of Union Carbide Corp.) and 0.1 g of 2-ethyl-4-methylimidazole. This mixture was then dissolved into 80 g of ethyleneglycol monomethylether, thereby obtaining a 59% conc. resin composition for laminated plate, according to one example of the present invention.

This resin composition was impregnated into woven fabric of glass having a thickness of 0.18 mm, followed by drying the impregnated resin composition. As the result, there was obtained a prepreg with a resin content of 50% by weight. Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm$^2$ of a compression, and 90 min. of a pressing time.

Table 6 below shows the results of evaluation of the physical and electrical properties of the copper-lined laminate obtained in the above-described manner.

EXAMPLE 39

To 100 g of poly-functional epoxy resin ("EPPN-502", a tradename for a product of Nihon Kayaku K. K.), as represented by the following chemical formula, there were admixed 100 g of bisphenol A type epoxy resin ("YD-115", a tradename for a product of Toto Kasei K. K.), 85 g of tetrabromobisphenol A, and 0.01 g of triphenylphosphine.

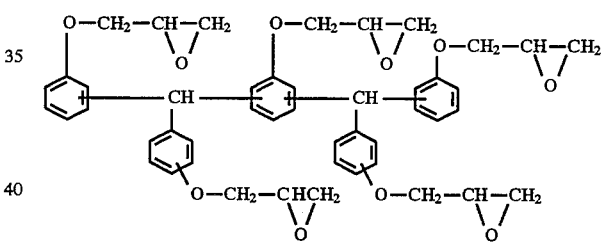

Then, the mixture was heated for one hour at a temperature of 130° C., from which poly-functional epoxy resin (A) with a ratio of reaction of 80% between the epoxy group and the hydroxyl group in the composition was obtained.

To 100 g of a composition (I) obtained by mixing this poly-functional epoxy resin (A) and 29 g of bisphenol A novolac type phenolic resin ("YLH-129", a tradename for a product of Yuka-Shell Co. Ltd.), there were admixed 10 g of phenoxy resin (II) having a molecular weight of 30,000 and 0.1 g of 2-ethyl-4-methylimidazole. This mixture was then dissolved into 80 g of ethyleneglycol monomethylether, thereby obtaining a 58% conc. resin composition for laminated plate, according to another example of the present invention.

This resin composition was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm$^2$ of a compression, and 90 min. of a pressing time.

Table 6 below shows the results of evaluation of the physical and electrical properties of the copper-lined laminate obtained in the above-described manner.

EXAMPLE 40

To 100 g of poly-functional epoxy resin represented by the following chemical formula, there were admixed 250 g of bisphenol A type epoxy resin ("DR-331", a tradename for a product of Dow Chemical Co. Ltd.), 53 g of dibromobisphenol A, and 0.01 g of triphenylphosphine.

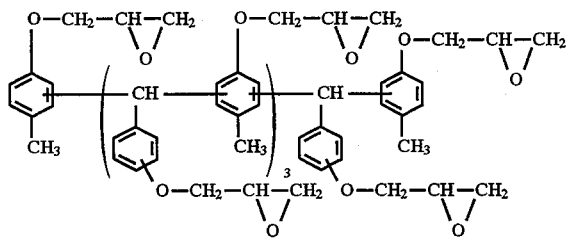

Then, the mixture was heated for one hour at a temperature of 130° C., from which poly-functional epoxy resin (A) with a ratio of reaction of 85% between the epoxy group and the hydroxyl group in the composition was obtained.

To 100 g of a composition (I) obtained by mixing this poly-functional epoxy resin (A) and 29 g of bisphenol A novolac type phenolic resin, there were admixed 10 g of polyparabanic acid (II) ("XT-4", a tradename for a product of Tohnen Sekiyu K. K.) and 0.1 g of 2-ethyl-4-methylimidazole. This mixture was then dissolved into 80 g of ethyleneglycol monomethylether, thereby obtaining a 58% conc. resin composition for laminated plate, according to still another example of the present invention.

The poly-functional epoxy resin represented by the above chemical formula is produced by the following procedures: 234 parts of paracresol and 211 parts of salicylaldehyde were reacted for 30 minutes at 100° C. in the presence of 0.3 part of concentrated hydrochloric acid, after which 0.5 part of p-toluensulfonic acid was added to the reaction product to further proceed with reaction for two hours at 180° C. to obtain polyphenol represented by the following chemical formula.

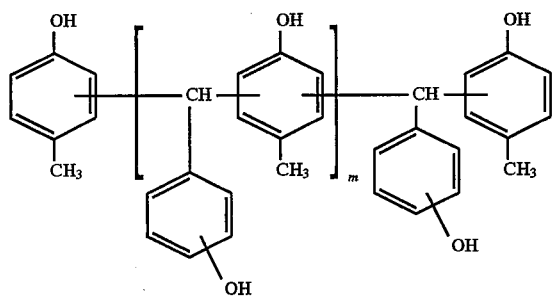

[where: m=3]

110 parts of this polyphenol was reacted with 150 parts of epichlorohydrin in accordance with ordinary method to result in the poly-functional epoxy resin.

This resin composition was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 90 min. of a pressing time.

Table 6 below shows the results of evaluation of the physical and electrical properties of the copper-lined laminate obtained in the above-described manner.

The phenolic resin used in this Example 40 was obtained by being concentrated by dehydration after two hours reaction, in reflux, of 100 parts of bisphenol A, 22 parts of 37% formaldehyde, and 1 part of oxalic acid in a flask equipped with a cooling tube and a stirrer.

COMPARATIVE EXAMPLE 14

To 125 g of epoxy resin ("EPIKOTE 5046B-80", a tradename for a product of Yuka-Shell Co. Ltd.), there were added 2 g of dicyandiamide and 0.15 g of 2-ethyl-4-methylimidazole. Then, the mixture was dissolved into 65 g of ethyleneglycol monomethylether, thereby obtaining a 53 wt % conc. resin composition for laminated plate.

This resin composition was impregnated into woven fabric of glass having a thickness of 0.18 mm, followed by drying the impregnated resin. As the result, there was obtained a prepreg with a resin content of 47% by weight.

Four sheets of this prepreg were laminated, and then copper foils of 35 μm thick each were placed onto both surfaces of the laminated prepreg, followed by press-shaping the combination. The shaping was done under the conditions of 170° C. of a pressing temperature, 40 kg/cm² of a compression, and 60 min. of a pressing time.

Table 6 below indicates the results of evaluation of the physical and electrical properties of the copper-lined laminate obtained in the above-described manner.

COMPARATIVE EXAMPLE 15

100 g of polyimide resin ("KELIMIDE-601", a tradename for a product of Nippon Polyimide K. K.) was dissolved into 100 g of N-methylpyrrolidone, thereby obtaining a 50 wt % conc. resin composition or laminated plate.

This resin composition was impregnated into woven fabric of glass having a thickness of 0.18 mm, followed by drying the impregnated resin at a temperature of 150° C. for 30 minutes, thereby obtaining a prepreg with a resin content of 45% by weight.

Four sheets of this prepreg were laminated, and then copper foils of 35 μm thick each were placed onto both surfaces of the laminated prepreg, and the combination was pressed under heat for 90 minutes, at a temperature of 220° C. and under a pressure of 40 kg/cm². Table 6 below indicates the results of evaluation of the physical and electrical properties of the copper-lined laminate obtained in the above-described manner.

As described in the foregoing examples of the present invention and the comparative examples, the resin compositions for laminated plate according to the present invention, in their cured form, are not only excellent in the heat-resistant property which is comparable with those of the conventional resin compositions for laminated plate, but also further excellent in the moisture-resistant property, mechanical strength, and adhesiveness.

TABLE 6

EVALUATIONS OF COPPER-LINED LAMINATED PLATE

| Particulars | Example 38 | Example 39 | Example 40 | Comparative Example 14 | Comparative Example 15 |
|---|---|---|---|---|---|
| Solder Heat-Resistance (sec, 260° C.) | >300 | >300 | >300 | >300 | >300 |
| Adhesive Strength of Copper Foils (kg/cm, at 200° C.) | 1.8 | 1.5 | 1.4 | 0.2 | 0.8 |
| Dielectric Resistance ($\Omega$) | $1.5 \times 10^{15}$ | $1.6 \times 10^{15}$ | $2.1 \times 10^{15}$ | $5.0 \times 10^{15}$ | $1.5 \times 10^{15}$ |
| Water Absorption (%) | 0.15 | 0.13 | 0.12 | 0.12 | 0.40 |
| Thermal Expansion Coefficient ($10^{-6}$/°C.) | 38 | 43 | 51 | 80 | 40 |
| Bending Strength (kg/mm$^2$) | 70 | 63 | 60 | 35 | 46 |
| Thermal Deformation Temperature (°C.) | 230 | 215 | 192 | 120 | 235 |

Note:
1) Solder heat-resistance, adhesive strength of copper foil, dielectric resistance, and water absorption are in accordance with JIS C-6481.
2) Thermal expansion coefficient, bending strength, and heat-deformation temperature are in accordance with JIS K-6911.

EXAMPLE 41

To 70 g of poly-functional epoxy resin ("TACTIX-742", a tradename for a product of Dow Chemical Co. Ltd.), as represented by the following chemical formula, there were admixed 3 g of monobromobisphenol A, 4 g of bisphenol A, and 0.01 g of triethylamine.

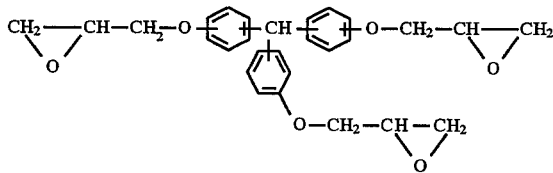

Then, the mixture was heated for three hours at a temperature of 100° C., from which poly-functional epoxy resin (A) with a ratio of reaction of 85% between the epoxy group and the hydroxyl group in the composition was obtained.

To 100 g of a composition (I) obtained by mixing this poly-functional epoxy resin (A) and 23 g of bisphenol A novolac type phenolic resin (B) ("KP-756P", a tradename for a product of Arakawa Kagaku Kogyo K. K.), there were admixed 15 g of phenoxy resin having a weight average molecular weight of 30,000 ("PKHH", a tradename for a product of Union Carbide Corp.), and 0.1 g of 2-ethyl-4-methylimidazole. This mixture was then dissolved into 80 g of ethyleneglycol monomethylether, thereby obtaining a 59% conc. resin composition for laminated plate, according to one example of the present invention.

This resin composition was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm$^2$ of a compression, and 90 min. of a pressing time.

Table 7 below shows the results of evaluation of the physical and electrical properties of the copper-lined laminate obtained in the above-described manner.

EXAMPLE 42

To 66 g of poly-functional epoxy resin ("EPPN-502", a tradename for a product of Nihon Kayaku K. K.), as represented by the following chemical formula, there were admixed 4 g of monobromobisphenol A, 5 g of bisphenol A, and 0.01 g of triphenylphosphine.

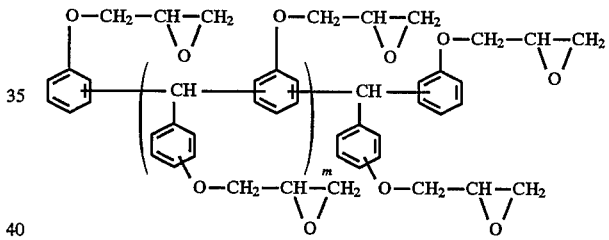

[where: m=1]

Then, the mixture was heated for three hours at a temperature of 100° C., from which poly-functional epoxy resin (A) with a ratio of reaction of 80% between the epoxy group and the hydroxyl group in the composition was obtained.

To 100 g of a composition (I) obtained by mixing this poly-functional epoxy resin (A) and 25 g of bisphenol A novolac type phenolic resin (B) ("YLH-129", a tradename for a product of Yuka-Shell Co. Ltd.), there were admixed 10 g of phenoxy resin having a weight average molecular weight of 30,000, and 0.1 g of 2-ethyl-4-methylimidazole. This mixture was then dissolved into 80 g of ethyleneglycol monomethylether, thereby obtaining a 58% conc. resin composition for laminated plate, according to other example of the present invention.

This resin composition was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surface of the laminated prepreg, followed by press-shaping the combination. The shaping was done under the conditions of 180° C. of a pressing temperature, 40 kg/cm$^2$ of a compression, and 90 min. of a pressing time.

Table 7 below shows the results of evaluation of the physical and electrical properties of the copper-lined laminate obtained in the above-described manner.

EXAMPLE 43

To 65 g of poly-functional epoxy resin represented by the following chemical formula, there were admixed 5 g of monobromobisphenol A, 10 g of bisphenol A, and 0.01 g of triphenylphosphine.

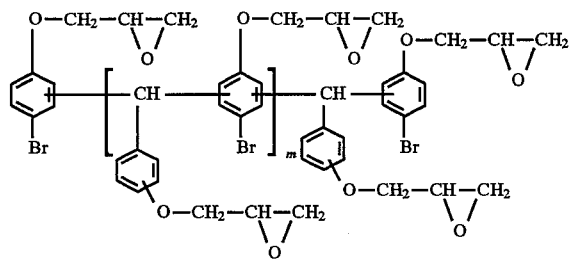

[where: m=3]

Then, the mixture was heated for three hours at a temperature of 100° C., from which poly-functional epoxy resin (A) with a ratio of reaction of 85% between the epoxy group and the hydroxyl group in the composition was obtained.

To 100 g of a composition (I) obtained by mixing this poly-functional epoxy resin (A) and 20 g of bisphenol A novolac type phenolic resin. (B), there were admixed 10 g of polyparabanic acid ("XT-4", a tradename for a product of Tohnen Sekiyu K. K.) and 0.1 g of 2-ethyl-4-methylimidazole. This mixture was then dissolved into 80 g of ethyleneglycol monomethylether, thereby obtaining a 58% conc. resin composition for laminated plate, according to still another example of the present invention.

The poly-functional epoxy resin represented by the above chemical formula is produced by the following procedures: 384 parts of parabromophenol and 61 parts of salicylaldehyde were reacted for 30 minutes at 100° C. in the presence of 0.3 part of concentrated hydrochloric acid, after which 0.5 part of p-toluensulfonic acid was added to the reaction product to further proceed with reaction for two hours at 180° C. to obtain polyphenol represented by the following-chemical formula.

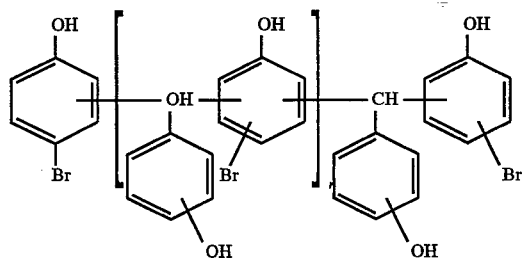

[where: n=3]

110 parts of this polyphenol was reacted with 740 parts of epichlorohydrin in accordance with ordinary method to result in the poly-functional epoxy resin.

This resin composition was impregnated into woven fabric of glass having a thickness of 0.18 mm, followed by drying the impregnated resin composition. As the result, there was obtained a prepreg with a resin content of 50% by weight.

Four sheets of this prepreg were laminated, and then copper foils of 35 μm thick each were placed onto both surfaces of the laminated prepreg, followed by press-shaping the combination. The shaping was done under the conditions of 180° C. of a pressing temperature, 40 kg/cm² of a compression, and 90 min. of a pressing time.

Table 7 below shows the results of evaluation of the physical and electrical properties of the copper-lined laminate obtained in the above-described manner.

The phenolic resin used in this Example 43 was obtained by being concentrated by dehydration after two hours reaction, in reflux, of 100 parts of bisphenol A, 22 parts of 37% formaldehyde, and 1 part of oxalic acid in a flask equipped with a cooling tube and a stirrer.

COMPARATIVE EXAMPLE 16

To 125 g of epoxy resin ("EPIKOTE 5046B-80", a tradename for a product of Yuka-Shell Co. Ltd.), there were added 2 g of dicyandiamide and 0.15 g of 2-ethyl-4-methylimidazole. Then, the mixture was dissolved, into 65 g of ethyleneglycol monomethylether, thereby obtaining a 53 wt % conc. resin composition for laminated plate.

This resin composition was impregnated into woven fabric of glass having a thickness of 0.18 mm, followed by drying the impregnated resin. As the result, there was obtained a prepreg with a resin content of 47% by weight.

Four sheets of this prepreg were laminated, and then copper foils of 35 μm thick each were placed onto both surfaces of the laminated prepreg, followed by press-shaping the combination. The shaping was done under the conditions of 170° C. of a pressing temperature, 40 kg/cm² of a compression, and 60 min. of a pressing time.

Table 7 below indicates the results of evaluation of the physical and electrical properties of the copper-lined laminate obtained in the above-described manner.

COMPARATIVE EXAMPLE 17

100 g of polyimide resin ("KELIMIDE-601", a tradename for a product of Nippon Polyimide K. K.) was dissolved into 100 g of N-methylpyrrolidone, thereby obtaining a 50 wt % conc. resin composition for laminated plate.

This resin composition was impregnated into woven fabric of glass having a thickness of 0.18 mm, followed by drying the impregnated resin at a temperature of 150° C. for 30 minutes, thereby obtaining a prepreg with a resin content of 45% by weight.

Four sheets of this prepreg were laminated, and then copper foils of 35 μm thick each were placed onto both surfaces of the laminated prepreg, and the combination was pressed under heat for 90 minutes, at a temperature of 220° C. and under a pressure of 40 kg/cm². Table 7 below indicates the results of evaluation of the physical and electrical properties of the copper-lined laminate obtained in the above-described manner.

As described in the foregoing examples of the present invention and the comparative examples, the resin compositions for laminated plate according to the present invention, in their cured form, are not only excellent in the heat-resistant property which is comparable with those of the conventional resin compositions for laminated plate, but also further excellent in the moisture-resistant property, mechanical strength, and adhesiveness.

TABLE 7

EVALUATIONS OF COPPER-LINED LAMINATED PLATE

| Particulars | Example 41 | Example 42 | Example 43 | Comparative Example 16 | Comparative Example 17 |
|---|---|---|---|---|---|
| Solder Heat-Resistance (sec, 260° C.) | >300 | >300 | >300 | >300 | >300 |
| Adhesive Strength of Copper Foils (kg/cm, at 200° C.) | 1.8 | 1.8 | 1.6 | 0.2 | 0.8 |
| Dielectric Resistance ($\Omega$) | $1.5 \times 10^{15}$ | $1.8 \times 10^{15}$ | $2.0 \times 10^{15}$ | $5.0 \times 10^{14}$ | $1.5 \times 10^{15}$ |
| Water Absorption (%) | 0.15 | 0.11 | 0.18 | 0.12 | 0.40 |
| Thermal Expansion Coefficient ($10^{-6}$/°C.) | 48 | 43 | 42 | 80 | 40 |
| Bending Strength (kg/mm$^2$) | 70 | 65 | 75 | 35 | 46 |
| Thermal Deformation Temperature (°C.) | 205 | 210 | 230 | 120 | 235 |

Note:
1) Solder heat-resistance, adhesive strength of copper foil, dielectric resistance, and water absorption are in accordance with JIS C-6481.
2) Thermal expansion coefficient, bending strength, and heat-deformation temperature are in accordance with JIS K-6911.

As so far been described in the foregoing, the resin composition for laminated plate according to the present invention is superior in its heat-resistant property to the conventional resin composition for laminated plate. Moreover, it is also excellent in its mechanical strength, toughness, and flexibility. In particular, when the resin composition is utilized for producing copper-lined laminate, the product exhibits excellent properties such as adhesiveness and long term electrical insulation.

We claim:

1. A resin composition for laminate, which comprises a mixture of 100 parts by weight of a composition (i), and 1 to 60 parts by weight of a composition (II) of a straight chain phenoxy resin (c) having a weight average molecular weight of 5,000 to 100,000 and being miscible with said composition (I), said composition (I) being obtained by mixing (i) a poly-functional epoxy resin (A') produced by reacting a composition, which is a blend of an epoxy resin composition ($\alpha$), obtained by mixing a poly-functional epoxy resin ($\alpha_1$) represented by the following formula

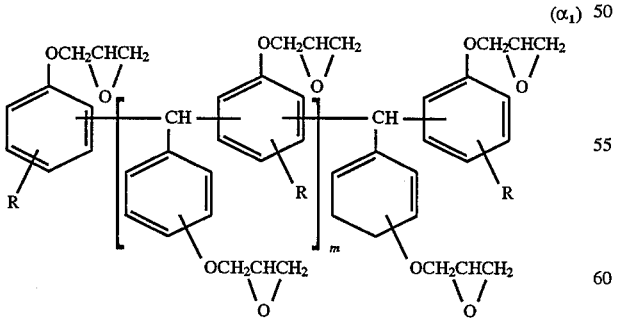

where R is hydrogen or CH$_3$ and m is zero or an integer from 1 to 5 and ($\alpha_2$) of the formula

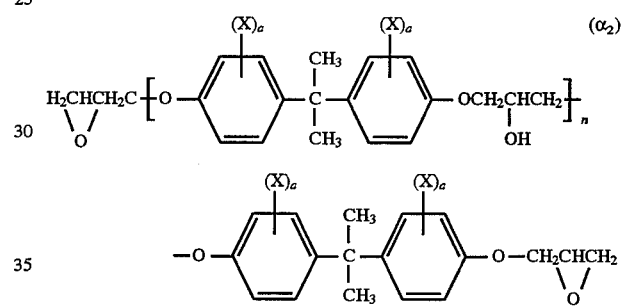

where n is zero or above, X denotes bromine or hydrogen and a is an integer from 1 to 4 at a weight ratio of from 100:0 to 30:70, and brominated bisphenol A ($\beta$) of the formula

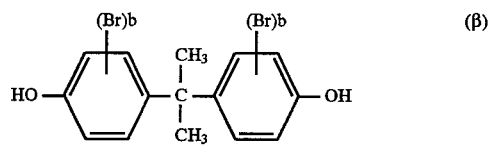

where b is an integer of from 1 to 4 at such a blending ratio that the hydroxyl group in said brominated bisphenol A ($\beta$) ranges from 0.05 to 0.5 equivalent with respect to 1 equivalent of the terminal epoxy group in said epoxy resin composition ($\alpha$), and by subjecting the composition to a reaction until a rate of reaction of the epoxy group and the hydroxyl group becomes 80% or above; with (ii) a phenolic resin (B) having a weight average molecular weight of from 1,000 to 10,000, which is a polycondensate of bisphenol A and formaldehyde, at such a mixing ratio that the hydroxyl group in said phenolic resin (B) ranges from 0.7 to 1.2 equivalents with respect to 1 equivalent of the terminal epoxy group in said poly-functional epoxy resin (A').

* * * * *